US010991691B2

United States Patent
Fan et al.

(10) Patent No.: US 10,991,691 B2
(45) Date of Patent: *Apr. 27, 2021

(54) SEMICONDUCTOR DEVICE HAVING FINS AND AN ISOLATION REGION

(71) Applicant: Taiwan Semiconductor Manufacturing Company, Ltd., Hsinchu (TW)

(72) Inventors: Chia-Sheng Fan, Zhubei (TW); Bao-Ru Young, Zhubei (TW); Tung-Heng Hsieh, Zhudong Town (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/722,271

(22) Filed: Dec. 20, 2019

(65) Prior Publication Data

US 2020/0135726 A1 Apr. 30, 2020

Related U.S. Application Data

(60) Continuation of application No. 16/050,553, filed on Jul. 31, 2018, now Pat. No. 10,515,957, which is a (Continued)

(51) Int. Cl.
*H01L 27/088* (2006.01)
*H01L 21/8234* (2006.01)
(Continued)

(52) U.S. Cl.
CPC ...... *H01L 27/0886* (2013.01); *H01L 21/0217* (2013.01); *H01L 21/0223* (2013.01);
(Continued)

(58) Field of Classification Search
CPC ............. H01L 27/0924; H01L 27/0886; H01L 27/11829–11833; H01L 27/10826;
(Continued)

(56) References Cited

U.S. PATENT DOCUMENTS 8,809,139 B2   8/2014  Huang et al.
8,901,607 B2  12/2014  Wang et al.
(Continued)

FOREIGN PATENT DOCUMENTS

CN   104979198 A  10/2015
CN   106601814 A   4/2017
KR  20160074859 A   6/2016

*Primary Examiner* — Khiem D Nguyen
(74) *Attorney, Agent, or Firm* — Slater Matsil, LLP

(57) ABSTRACT

A semiconductor device and method includes: forming a first fin and a second fin on a substrate; forming a dummy gate material over the first fin and the second fin; forming a recess in the dummy gate material between the first fin and the second fin; forming a sacrificial oxide on sidewalls of the dummy gate material in the recess; filling an insulation material between the sacrificial oxide on the sidewalls of the dummy gate material in the recess; removing the dummy gate material and the sacrificial oxide; and forming a first replacement gate over the first fin and a second replacement gate over the second fin.

20 Claims, 25 Drawing Sheets

Related U.S. Application Data division of application No. 15/581,565, filed on Apr. 28, 2017, now Pat. No. 10,354,997.

(51) Int. Cl.
| | |
|---|---|
| *H01L 29/66* | (2006.01) |
| *H01L 27/092* | (2006.01) |
| *H01L 21/8238* | (2006.01) |
| *H01L 21/02* | (2006.01) |
| *H01L 29/06* | (2006.01) |
| *H01L 29/423* | (2006.01) |

(52) U.S. Cl.
CPC .......... *H01L 21/02255* (2013.01); *H01L 21/823431* (2013.01); *H01L 21/823437* (2013.01); *H01L 21/823481* (2013.01); *H01L 21/823821* (2013.01); *H01L 27/0924* (2013.01); *H01L 29/0649* (2013.01); *H01L 29/42376* (2013.01); *H01L 29/66545* (2013.01); *H01L 29/66553* (2013.01); *H01L 21/823828* (2013.01); *H01L 21/823878* (2013.01)

(58) Field of Classification Search
CPC .......... H01L 27/1211; H01L 29/66795; H01L 29/785; H01L 29/0649; H01L 29/42356; H01L 29/42376; H01L 21/823481; H01L 21/823878; H01L 21/0223; H01L 21/823437; H01L 21/823828; H01L 21/823431; H01L 21/823821; H01L 21/845

See application file for complete search history.

(56) References Cited

U.S. PATENT DOCUMENTS

| | | | |
|---|---|---|---|
| 8,987,791 B2 | 3/2015 | Huang et al. | |
| 9,048,121 B2* | 6/2015 | Kawa | G06F 30/394 |
| 9,214,556 B2 | 12/2015 | Wann et al. | |
| 9,461,170 B2* | 10/2016 | Lin | H01L 27/0266 |
| 9,496,363 B1 | 11/2016 | Chang et al. | |
| 10,515,957 B2* | 12/2019 | Fan | H01L 21/82343 |
| 2003/0006457 A1 | 1/2003 | Nishinohara | |
| 2003/0190798 A1 | 10/2003 | Hayakawa | |
| 2008/0308858 A1 | 12/2008 | Sandhu et al. | |
| 2010/0072553 A1 | 3/2010 | Xu et al. | |
| 2013/0037886 A1 | 2/2013 | Tsai et al. | |
| 2013/0105878 A1* | 5/2013 | Ding | H01L 27/115 257/315 |
| 2013/0187206 A1 | 7/2013 | Mor et al. | |
| 2014/0097496 A1 | 4/2014 | Hu et al. | |
| 2014/0203376 A1* | 7/2014 | Xie | H01L 29/66795 257/401 |
| 2014/0239354 A1* | 8/2014 | Huang | H01L 29/0653 257/288 |
| 2015/0102386 A1 | 4/2015 | Chen et al. | |
| 2015/0115334 A1 | 4/2015 | Liaw | |
| 2015/0236131 A1 | 8/2015 | Chang et al. | |
| 2016/0020150 A1* | 1/2016 | You | H01L 29/165 438/218 |
| 2016/0181425 A1 | 6/2016 | Bai et al. | |
| 2016/0197017 A1 | 7/2016 | Ju | |
| 2016/0204215 A1 | 7/2016 | Chang et al. | |
| 2016/0268392 A1* | 9/2016 | Zhu | H01L 29/66545 |
| 2016/0336320 A1 | 11/2016 | Lin | |
| 2018/0277440 A1 | 9/2018 | Yu et al. | |

\* cited by examiner

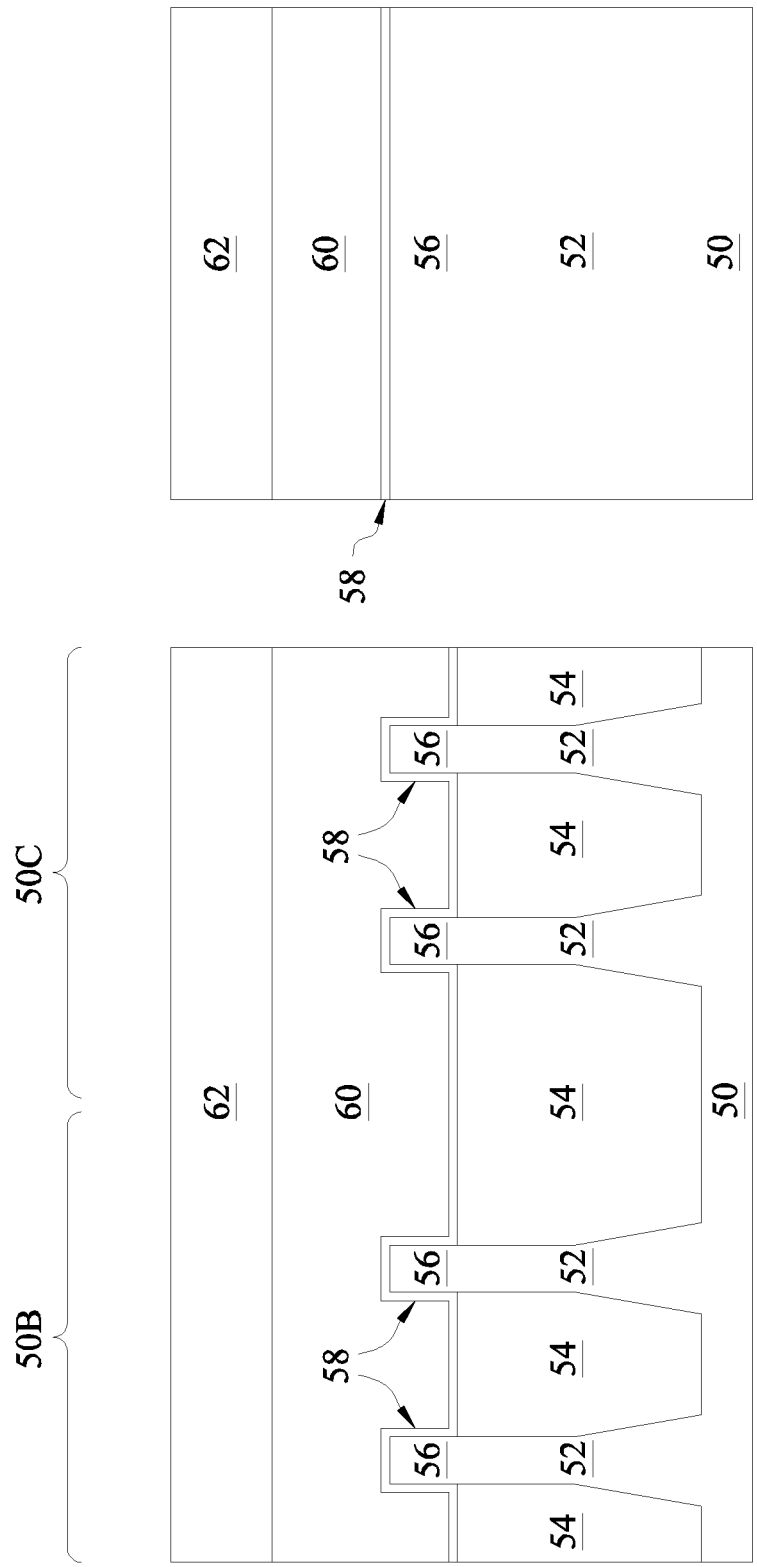

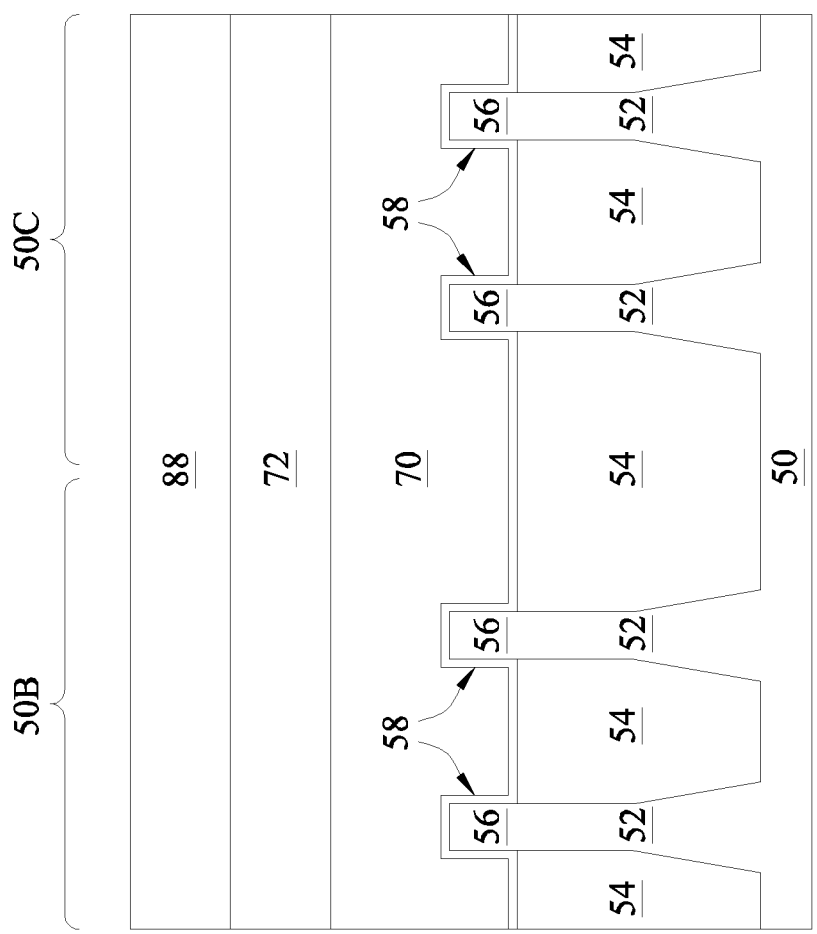
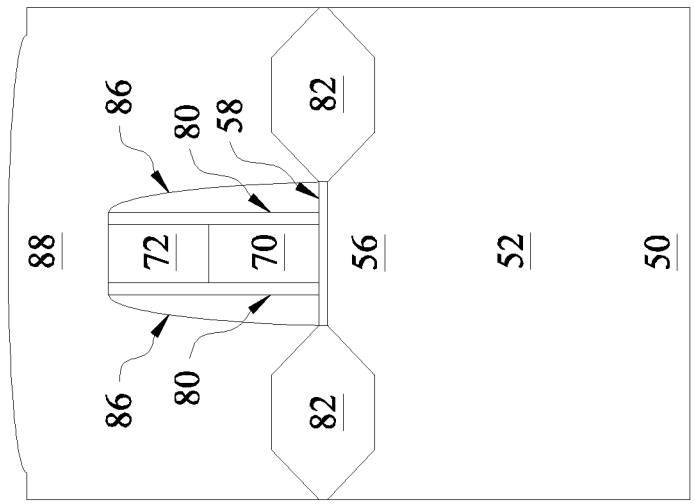
Figure 10A
Figure 10B

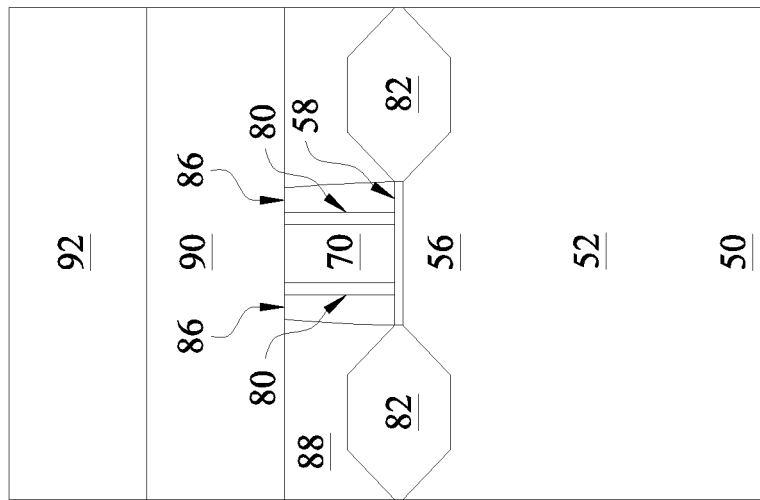
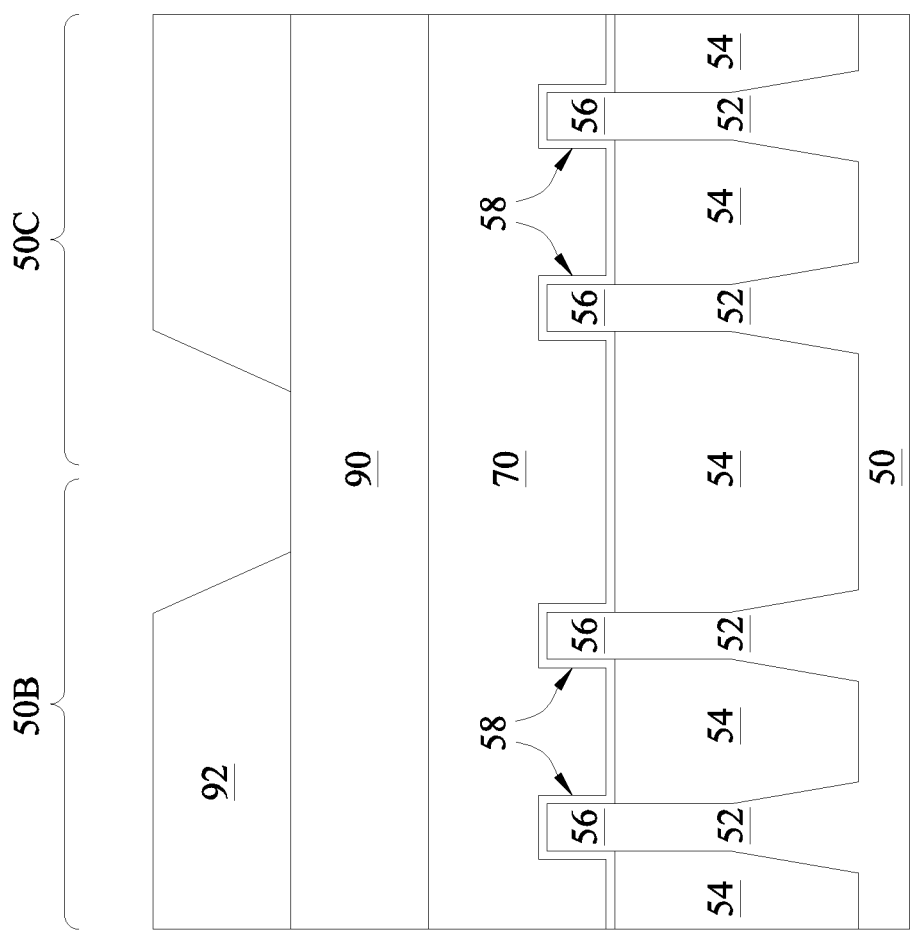
Figure 13B
Figure 13A

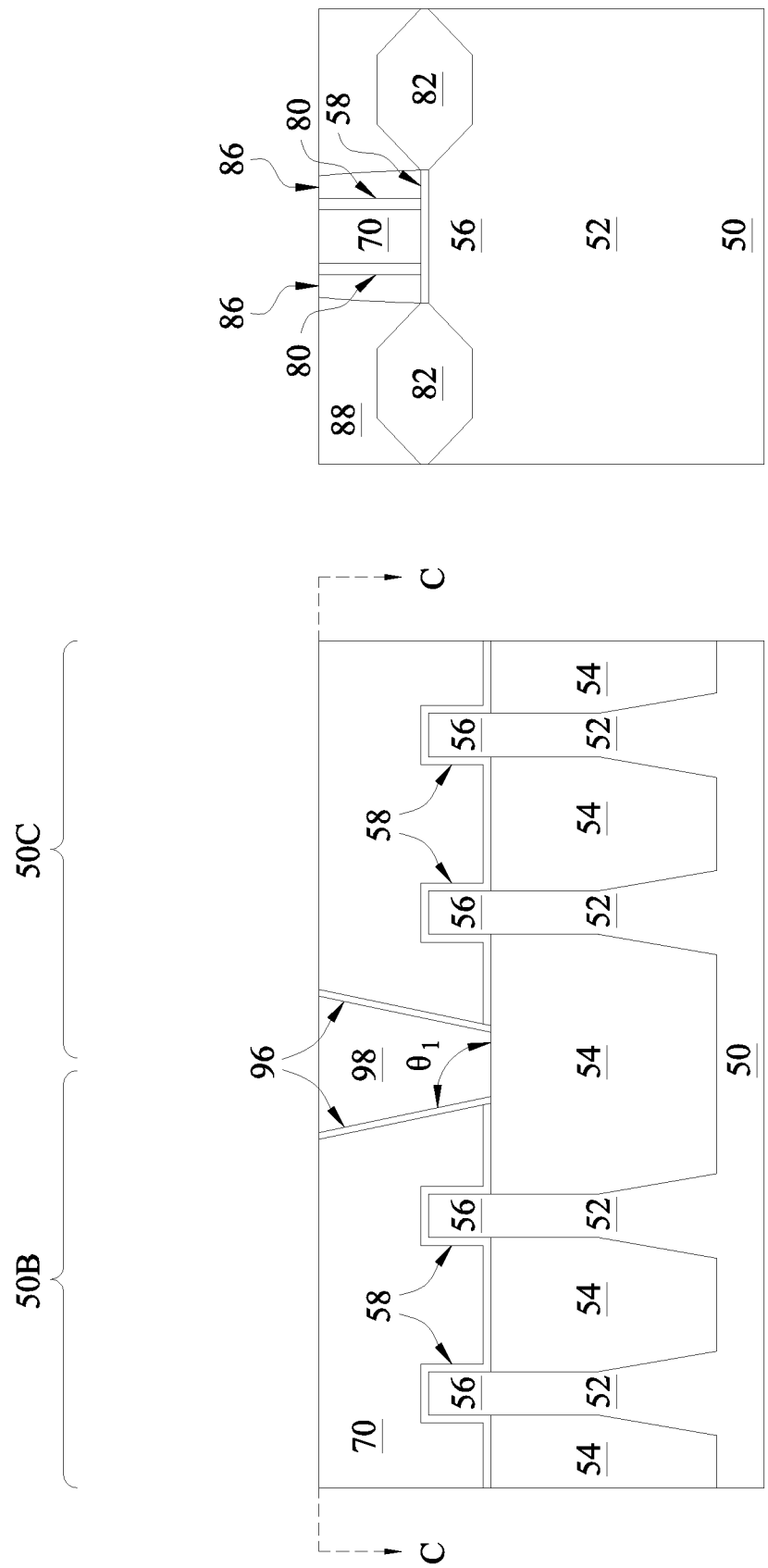

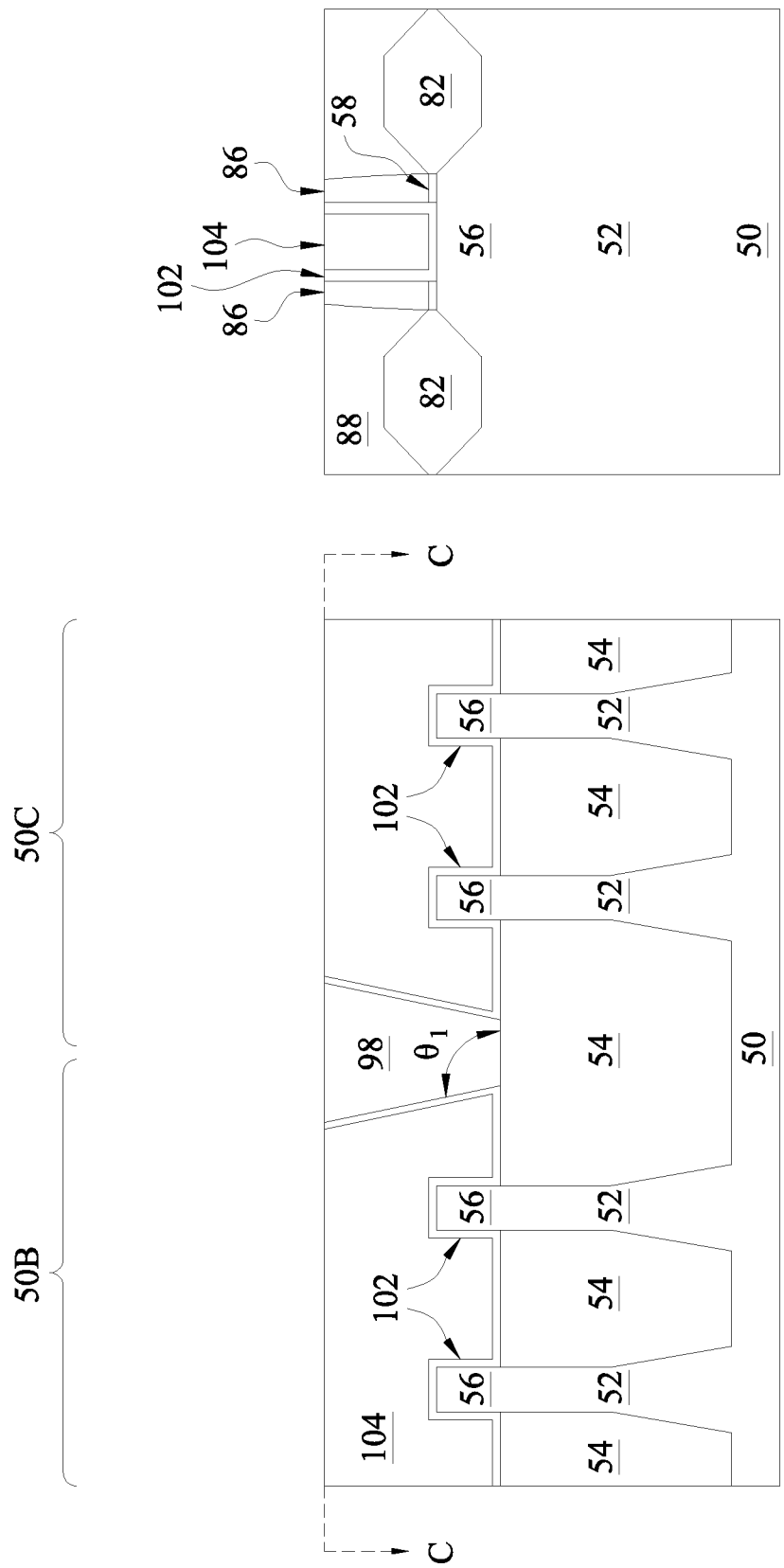

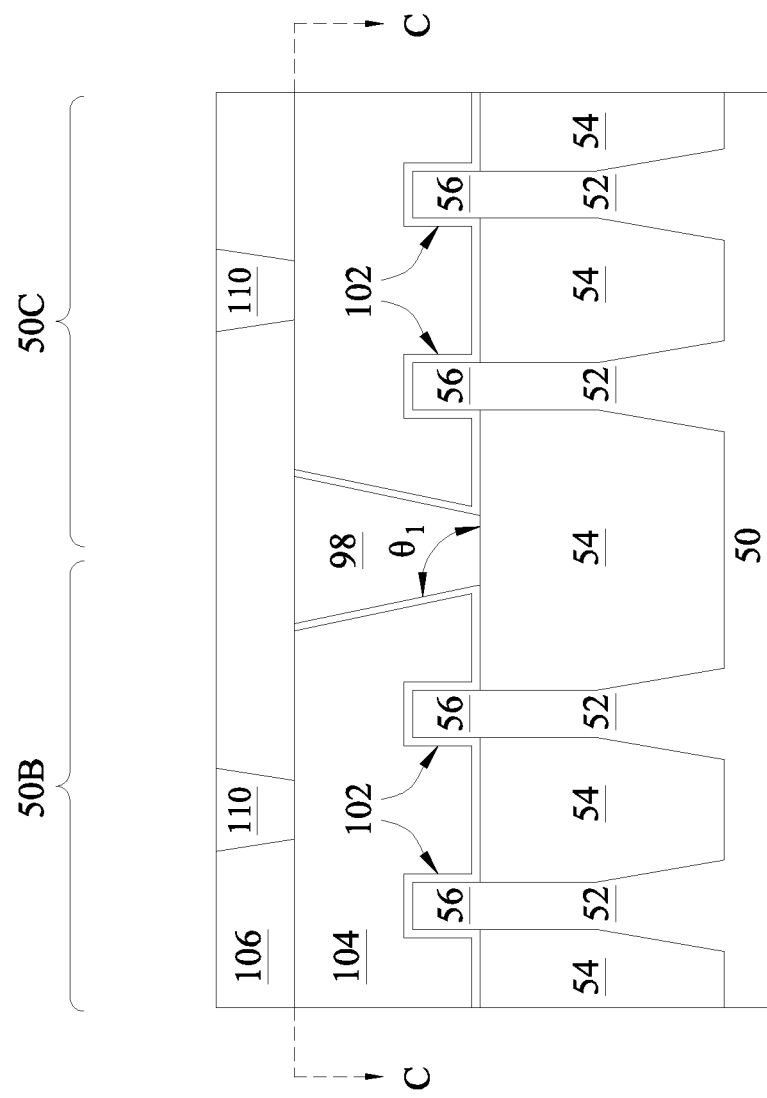
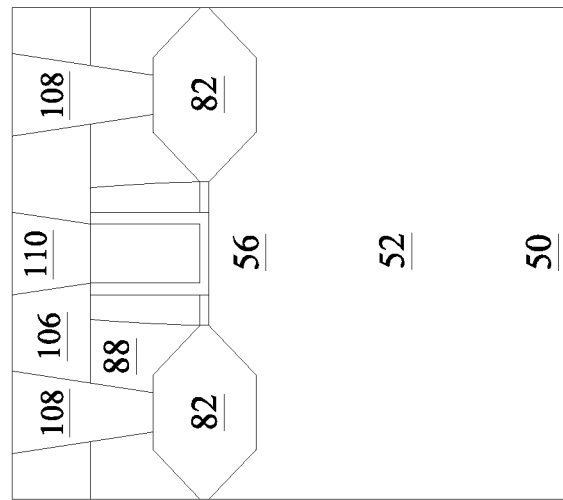
Figure 19A
Figure 19B

SEMICONDUCTOR DEVICE HAVING FINS AND AN ISOLATION REGION

PRIORITY CLAIM AND CROSS-REFERENCE

This application is continuation of U.S. application Ser. No. 16/050,553, filed on Jul. 31, 2018, and entitled "Semiconductor Device Having Fins," now U.S. Pat. No. 10,515,957, issued on Dec. 24, 2019, which application is divisional of U.S. application Ser. No. 15/581,565, filed on Apr. 28, 2017, and entitled "Method for Manufacturing Semiconductor Device with Replacement Gates," now U.S. Pat. No. 10,354,997, issued on Jul. 16, 2019, which applications are incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise within each of the processes that are used, and these additional problems should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 through 19C are cross-sectional and plan views of intermediate stages in the manufacturing of FinFETs, in accordance with some embodiments.

DETAILED DESCRIPTION

Figure 1:
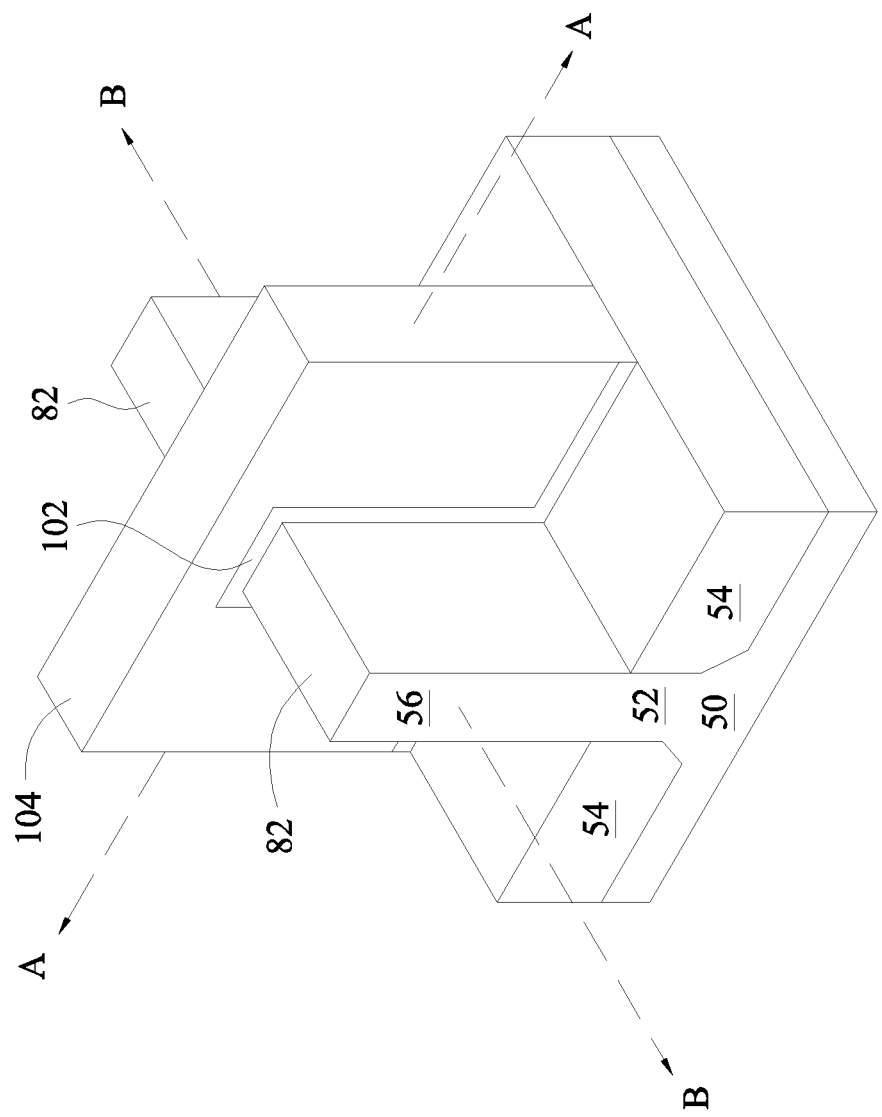
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor device and method of forming the same is provided in accordance with various embodiments. In particular, an isolation region is formed between neighboring gates of FinFET devices. The FinFET devices are formed in a gate-last process, where dummy gates are formed of polysilicon in an intermediate step of manufacturing. A recess is formed in the dummy gates between neighboring fins, and exposed sidewalls of the dummy gates are oxidized to form a sacrificial oxide. The recess is filled with an insulating material that forms the isolation region. The dummy gates and the sacrificial oxide are removed and replaced with metal gates. Forming the sacrificial oxide after forming the isolation region but before forming the metal gates increases a gap fill distance between the isolation region and the metal gates. As such, the formation of voids and pits between the isolation region and the metal gates may be reduced when the metal gates are formed.

FIG. 1 illustrates an example of a FinFET in a three-dimensional view. The FinFET comprises a fin 56 on a substrate 50. The substrate 50 includes isolation regions 54, and the fin 56 protrudes above and from between neighboring isolation regions 54. A gate dielectric 102 is along sidewalls and over a top surface of the fin 56, and a gate electrode 104 is over the gate dielectric 102. Source/drain regions 82 are disposed in opposite sides of the fin 56 with respect to the gate dielectric 102 and gate electrode 104. FIG. 1 further illustrates reference cross-sections and lines that are used in later figures. Cross-section A-A is across a channel, gate dielectric 102, and gate electrode 104 of the FinFET. Cross-section B-B is perpendicular to cross-section A-A and is along a longitudinal axis of the fin 56 and in a direction of, for example, a current flow between the source/drain regions 82. Subsequent figures refer to these reference cross-sections for clarity.

FIGS. 2 through 5 are cross-sectional views of intermediate stages in the manufacturing of FinFETs in accordance with some embodiments. FIGS. 2 through 5 are illustrated along cross-section A-A of FIG. 1, except for multiple FinFETs.

Figure 2:
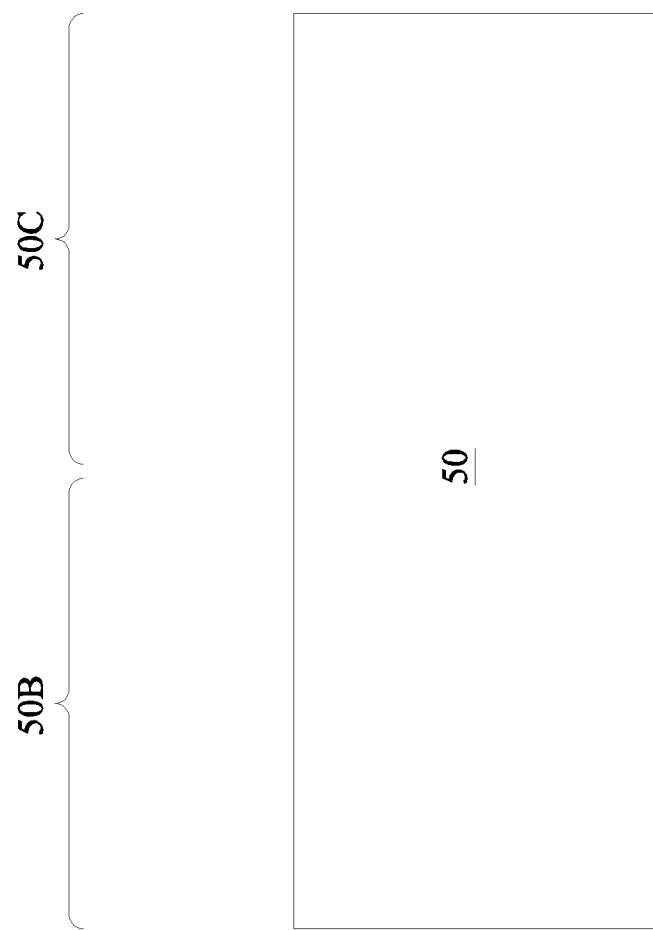

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a first region 50B and a second region 50C. The first region 50B can be for forming n-type devices, such as n-type metal-oxide-semiconductor (NMOS) field-effect transistors, e.g., n-type FinFETs. The second region 50C can be for forming p-type devices, such as p-type metal-oxide-semiconductor (PMOS) field-effect transistors, e.g., p-type FinFETs. In some embodiments, both the first region 50B and the second region 50C are used to form the same type of devices, such as both regions being for n-type devices or p-type devices.

Figure 3:
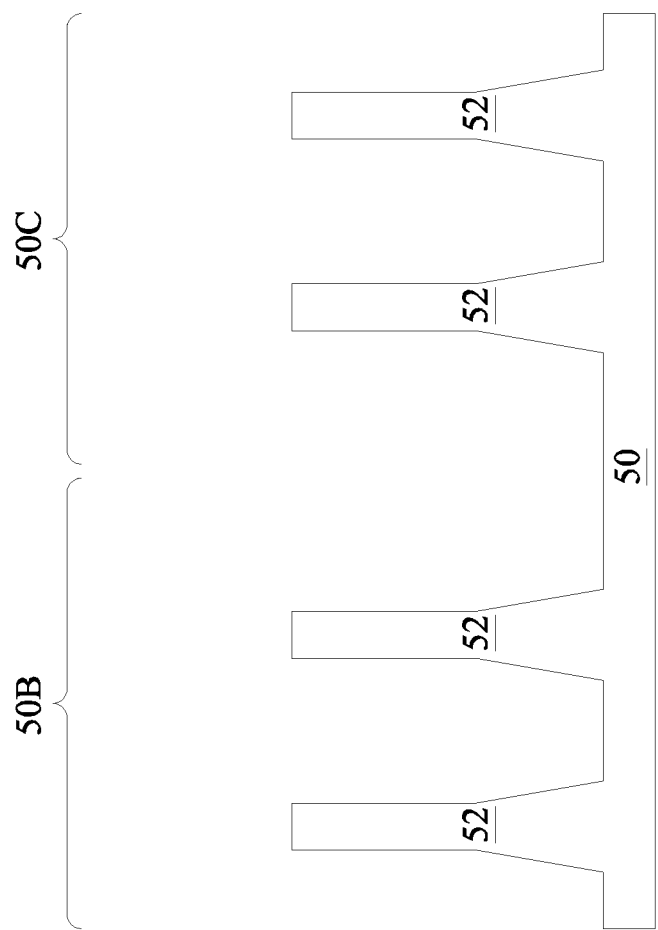

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic. The fins 52 may each have parallel longitudinal axes.

Figure 4:
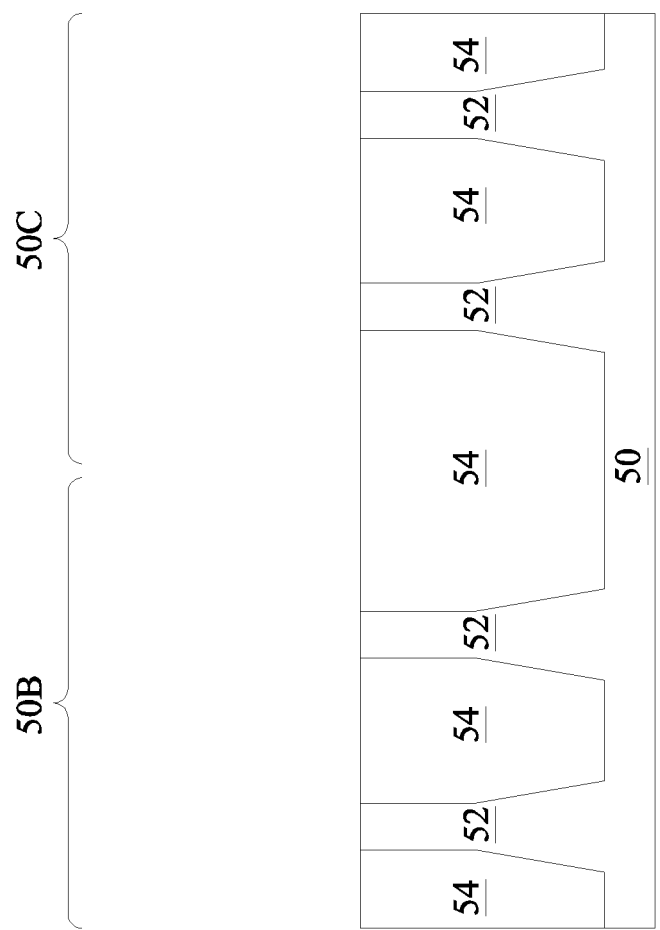

In FIG. 4, an insulation material 54 is formed between neighboring fins 52 to form the isolation regions 54. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. The insulating material 54 may be referred to as isolation regions 54. Further in FIG. 4, a planarization process, such as a chemical mechanical polish (CMP), may remove any excess insulation material 54 and form top surfaces of the isolation regions 54 and top surfaces of the fins 52 that are level.

Figure 5:
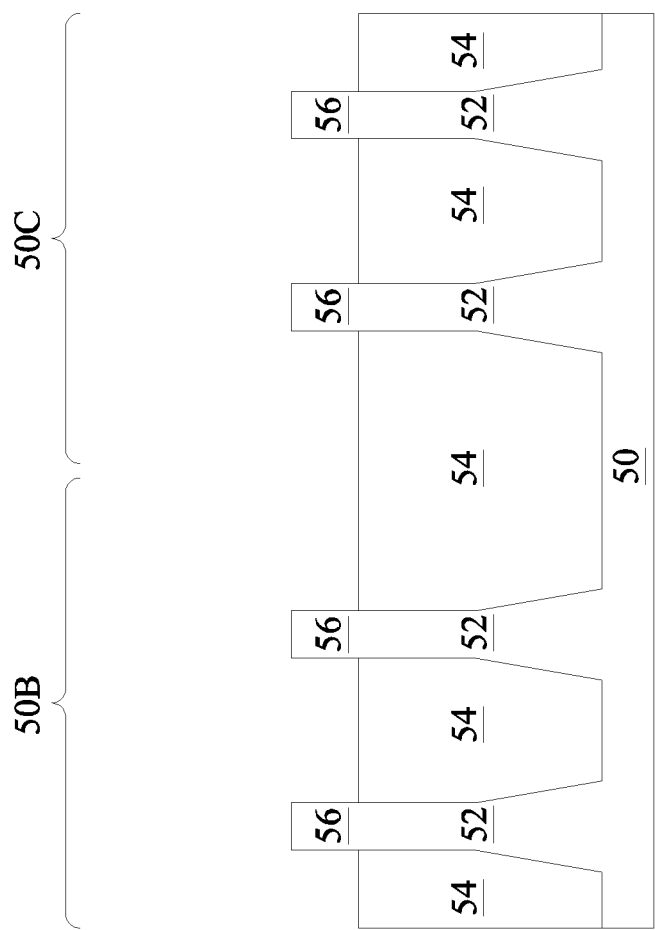

In FIG. 5, the isolation regions 54 are recessed to form Shallow Trench Isolation (STI) regions 54. The isolation regions 54 are recessed such that fins 56 in the first region 50B and in the second region 50C protrude from between neighboring isolation regions 54. Further, the top surfaces of the isolation regions 54 may have a flat surface as illustrated, a convex surface, a concave surface (such as dishing), or a combination thereof. The top surfaces of the isolation regions 54 may be formed flat, convex, and/or concave by an appropriate etch. The isolation regions 54 may be recessed using an acceptable etching process, such as one that is selective to the material of the isolation regions 54. For example, a chemical oxide removal using a CERTAS® etch or an Applied Materials SICONI tool or dilute hydrofluoric (dHF) acid may be used.

A person having ordinary skill in the art will readily understand that the process described with respect to FIGS. 2 through 5 is just one example of how the fins 56 may be formed. In some embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In some embodiments, heteroepitaxial structures can be used for the fins 52. For example, the fins 52 in FIG. 4 can be recessed, and a material different from the fins 52 may be epitaxially grown in their place. In an even further embodiment, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form the fins 56. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 56 may be formed from silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 5, appropriate wells (not shown) may be formed in the fins 56, the fins 52, and/or the substrate 50. In some embodiments, a P well may be formed in the first region 50B, and an N well may be formed in the second region 50C. In some embodiments, a P well or an N well are formed in both the first region 50B and the second region 50C.

In the embodiments with different well types, the different implant steps for the first region 50B and the second region 50C may be achieved using a photoresist or other masks (not shown). For example, a photoresist may be formed over the fins 56 and the isolation regions 54 in the first region 50B. The photoresist is patterned to expose the second region 50C of the substrate 50, such as a PMOS region. The photoresist can be formed by using a spin-on technique and can be patterned using acceptable photolithography techniques. Once the photoresist is patterned, an n-type impurity implant is performed in the second region 50C, and the photoresist may act as a mask to substantially prevent n-type impurities from being implanted into the first region 50B, such as an NMOS region. The n-type impurities may be phosphorus, arsenic, or the like implanted in the first region to a concentration of equal to or less than $10^{18}$ $cm^{-3}$, such as between about $10^{17}$ $cm^{-3}$ and about $10^{18}$ $cm^{-3}$. After the implant, the photoresist is removed, such as by an acceptable ashing process.

Following the implanting of the second region 50C, a photoresist is formed over the fins 56 and the isolation regions 54 in the second region 50C. The photoresist is patterned to expose the first region 50B of the substrate 50, such as the NMOS region. The photoresist can be formed by using a spin-on technique and can be patterned using acceptable photolithography techniques. Once the photoresist is patterned, a p-type impurity implant may be performed in the first region 50B, and the photoresist may act as a mask to substantially prevent p-type impurities from being implanted into the second region 50C, such as the PMOS region. The p-type impurities may be boron, BF2, or the like implanted in the first region to a concentration of equal to or less than $10^{18}$ $cm^{-3}$, such as between about $10^{17}$ $cm^{-3}$ and about $10^{18}$ $cm^{-3}$. After the implant, the photoresist may be removed, such as by an acceptable ashing process.

After the implants of the first region 50B and the second region 50C, an anneal may be performed to activate the p-type and/or n-type impurities that were implanted. In some embodiments, the grown materials of epitaxial fins may be in situ doped during growth, which may obviate the implantations, although in situ and implantation doping may be used together.

FIGS. 6A through 19C are cross-sectional and plan views of further intermediate stages in the manufacturing of FinFETs in accordance with some embodiments. In FIGS. 6A through 19C, figures ending with an "A" designation are illustrated along cross-section A-A of FIG. 1, except for multiple FinFETs. Figures ending with a "B" designation are illustrated along cross-section B-B of FIG. 1, and may be indicative of FinFETs in either the first region 50B or the second region 50C. Figures ending with a "C" designation are plan views illustrated with respect to respective C-C lines shown in the cross-sectional views.

In FIGS. 6A and 6B, a dummy dielectric layer 58 is formed on the fins 56. The dummy dielectric layer 58 may be, for example, silicon oxide, silicon nitride, a combination thereof, or the like, and may be deposited or thermally grown according to acceptable techniques. In some embodiments, the dummy dielectric layer 58 is conformally formed over the fins 56 and the isolation regions 54. In some embodiments (not shown), the dummy dielectric layer 58 is only formed on the top surface and sidewalls of the fins 56, and is not formed over the isolation regions 54.

Further in FIGS. 6A and 6B, a dummy gate layer 60 is formed over the dummy dielectric layer 58. The dummy gate layer 60 may be deposited over the dummy dielectric layer 58 and then planarized, such as by a CMP. The dummy gate layer 60 may be a conductive material and may be selected from a group including polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate layer 60 may be deposited by physical vapor deposition (PVD), CVD, sputter deposition, or other techniques known and used in the art for depositing conductive materials. The dummy gate layer 60 may be made of other materials that have a high etching selectivity from the etching of isolation regions.

Further in FIGS. 6A and 6B, a mask layer 62 is formed over the dummy gate layer 60. The mask layer 62 may be deposited over the dummy gate layer 60. The mask layer 62 may be formed from a dielectric, and may include, for example, SiN, SiON, or the like.

In this example, a single dummy gate layer 60 and a single mask layer 62 are formed across the first region 50B and the second region 50C. In some embodiments, separate dummy gate layers may be formed in the first region 50B and the second region 50C, and separate mask layers may be formed in the first region 50B and the second region 50C.

Figure 7B:
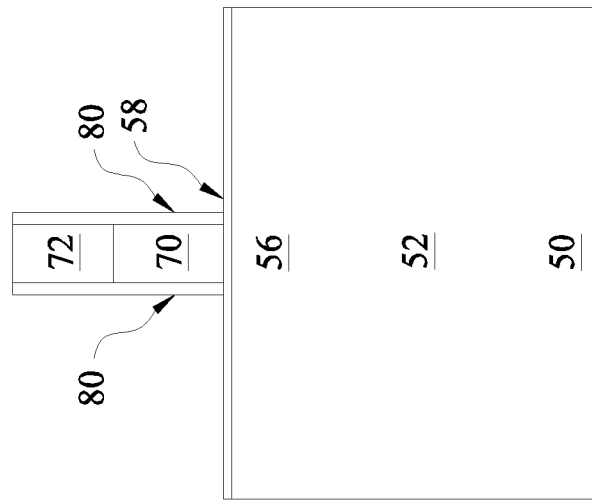
Figure 7A:
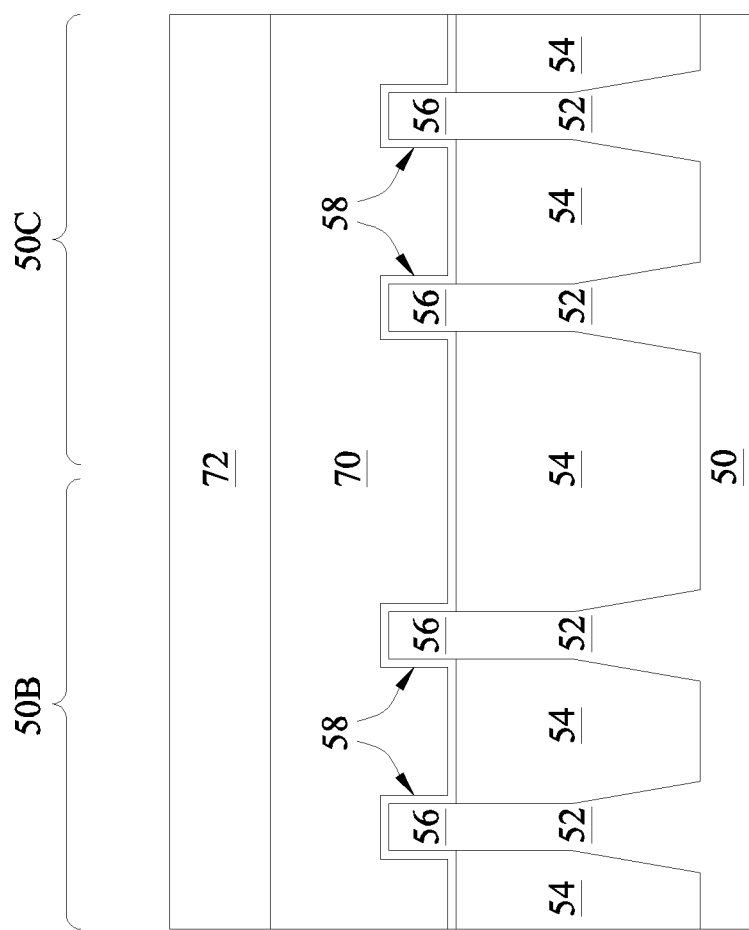

In FIGS. 7A and 7B, the mask layer 62 may be patterned using acceptable photolithography and etching techniques to form masks 72. The pattern of the masks 72 then may be transferred to the dummy gate layer 60 and the dummy dielectric layer 58 by an acceptable etching technique to form dummy gates 70. The dummy gates 70 cover respective channel regions of the fins 56. The dummy gates 70 may also have a lengthwise direction substantially perpendicular to the lengthwise direction of respective epitaxial fins.

Further in FIGS. 7A and 7B, gate seal spacers 80 can be formed on exposed surfaces of the dummy gates 70, the masks 72, and/or the fins 56. A thermal oxidation or a deposition followed by an anisotropic etch may form the gate seal spacers 80.

After the formation of the gate seal spacers 80, implants for lightly doped source/drain (LDD) regions (not shown) may be performed. In the embodiments with different device types, similar to the implants discussed above in FIGS. 4A and 4B, a mask, such as a photoresist, may be formed over the first region 50B, while exposing the second region 50C, and appropriate type (e.g., n-type or p-type) impurities may be implanted into the exposed fins 56 in the second region 50C. The mask may then be removed. Subsequently, a mask, such as a photoresist, may be formed over the second region 50C while exposing the first region 50B, and appropriate type impurities may be implanted into the exposed fins 56 in the first region 50B. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Figure 8B:
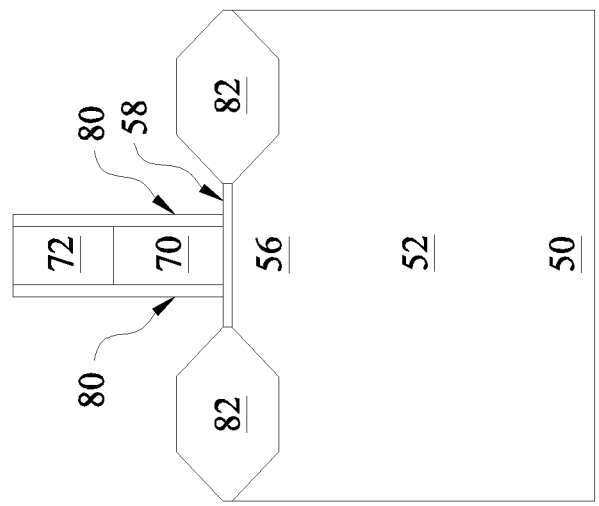
Figure 8A:
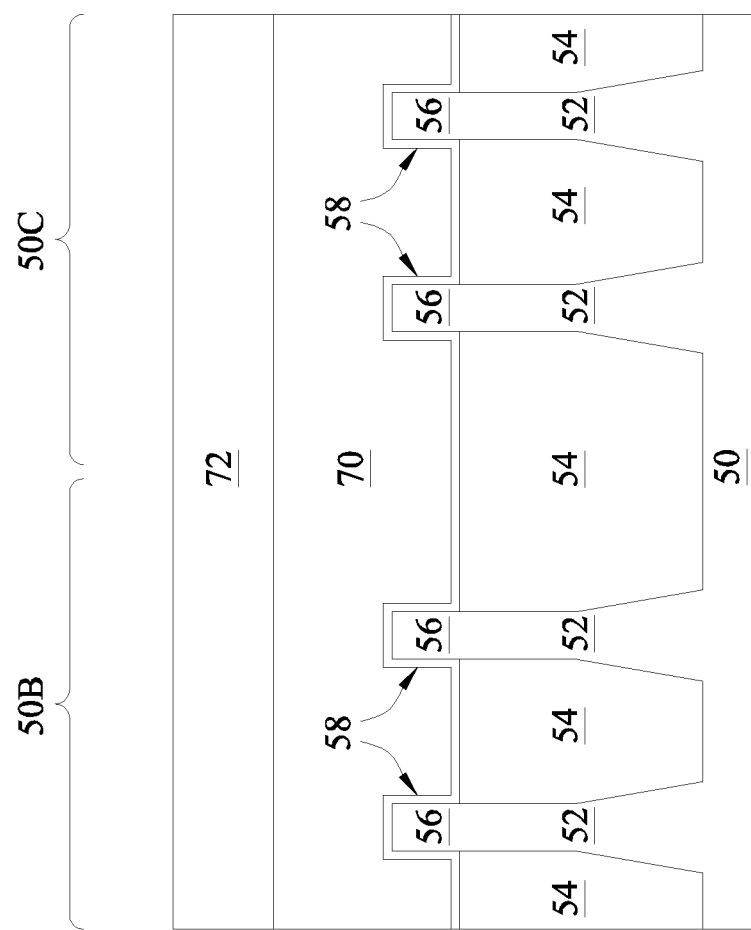

In FIGS. 8A and 8B epitaxial source/drain regions 82 are formed in the fins 56. The epitaxial source/drain regions 82 are formed in the fins 56 such that each dummy gate 70 is disposed between respective neighboring pairs of the epitaxial source/drain regions 82. In some embodiments that epitaxial source/drain regions 82 may extend into the fins 52.

The epitaxial source/drain regions 82 in the first region 50B, e.g., the NMOS region, may be formed by masking the second region 50C, e.g., the PMOS region, and conformally depositing a dummy spacer layer in the first region 50B followed by an anisotropic etch to form dummy gate spacers (not shown) along sidewalls of the dummy gates 70 and/or gate seal spacers 80 in the first region 50B. Then, source/drain regions of the epitaxial fins in the first region 50B are etched to form recesses. The epitaxial source/drain regions 82 in the first region 50B are epitaxially grown in the recesses. The epitaxial source/drain regions 82 may include any acceptable material, such as appropriate for n-type FinFETs. For example, if the fin 56 is silicon, the epitaxial source/drain regions 82 may include silicon, SiC, SiCP, SiP, or the like. The epitaxial source/drain regions 82 may have surfaces raised from respective surfaces of the fins 56 and may have facets. Subsequently, the dummy gate spacers in the first region 50B are removed, for example, by an etch, as is the mask on the second region 50C.

The epitaxial source/drain regions 82 in the second region 50C, e.g., the PMOS region, may be formed by masking the first region 50B, e.g., the NMOS region, and conformally depositing a dummy spacer layer in the second region 50C followed by an anisotropic etch to form dummy gate spacers (not shown) along sidewalls of the dummy gates 70 and/or gate seal spacers 80 in the second region 50C. Then, source/drain regions of the epitaxial fins in the second region 50C are etched to form recesses. The epitaxial source/drain regions 82 in the second region 50C are epitaxially grown in the recesses. The epitaxial source/drain regions 82 may include any acceptable material, such as appropriate for p-type FinFETs. For example, if the fin 56 is silicon, the epitaxial source/drain regions 82 may comprise SiGe, SiGeB, Ge, GeSn, or the like. The epitaxial source/drain regions 82 may have surfaces raised from respective surfaces of the fins 56 and may have facets. Subsequently, the dummy gate spacers in the second region 50C are removed, for example, by an etch, as is the mask on the first region 50B.

Figure 9B:
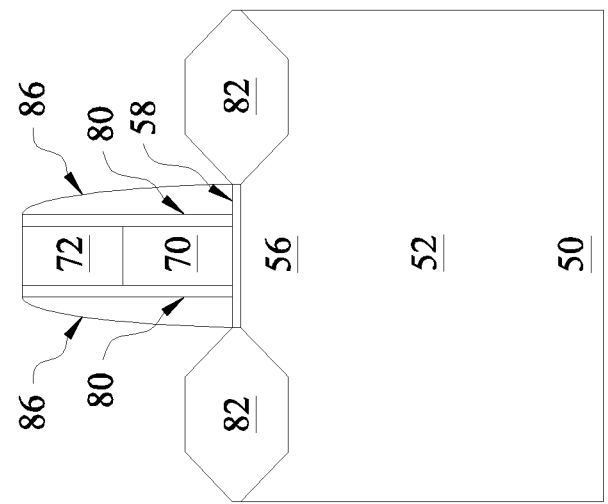
Figure 9A:
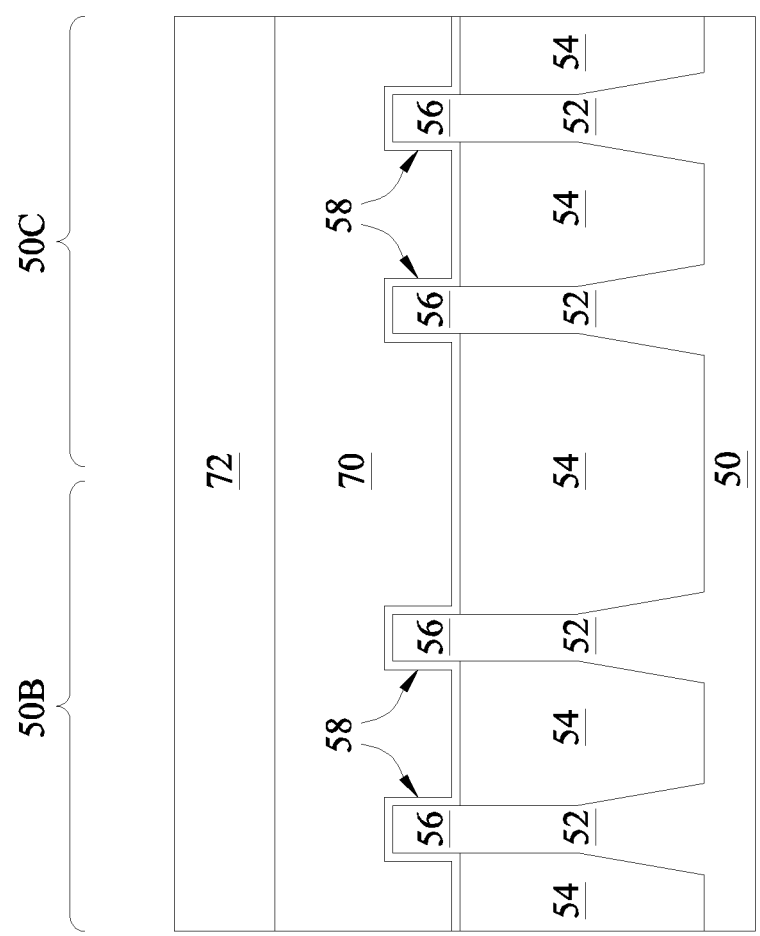

In FIGS. 9A and 9B, gate spacers 86 are formed on the gate seal spacers 80 along sidewalls of the dummy gates 70 and the masks 72. The gate spacers 86 may be formed by conformally depositing a material and subsequently anisotropically etching the material. The material of the gate spacers 86 may be a dielectric material such as silicon nitride, SiCN, a combination thereof, or the like.

The epitaxial source/drain regions 82 and/or the epitaxial fins may be implanted with dopants to form source/drain regions, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

In FIGS. 10A and 10B, an ILD 88 is deposited over the structure illustrated in FIGS. 9A and 9B. The ILD 88 may be formed of a dielectric material or a semiconductor material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Semiconductor materials may include amorphous silicon, silicon germanium ($Si_xGe_{1-x}$, where x can be between approximately 0 and 1), pure Germanium, or the like. Other insulation or semiconductor materials formed by any acceptable process may be used.

Figure 11B:
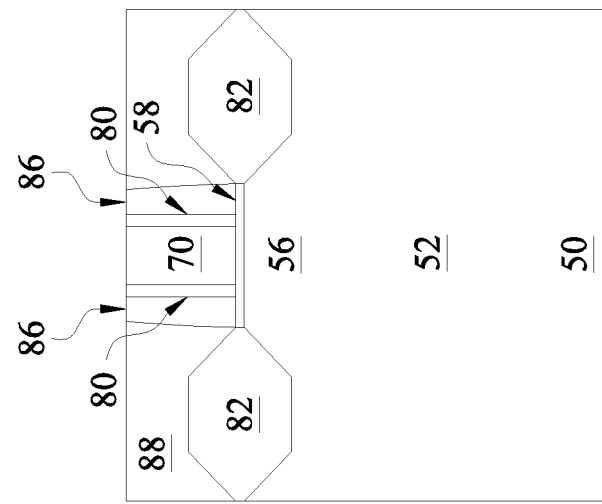
Figure 11A:
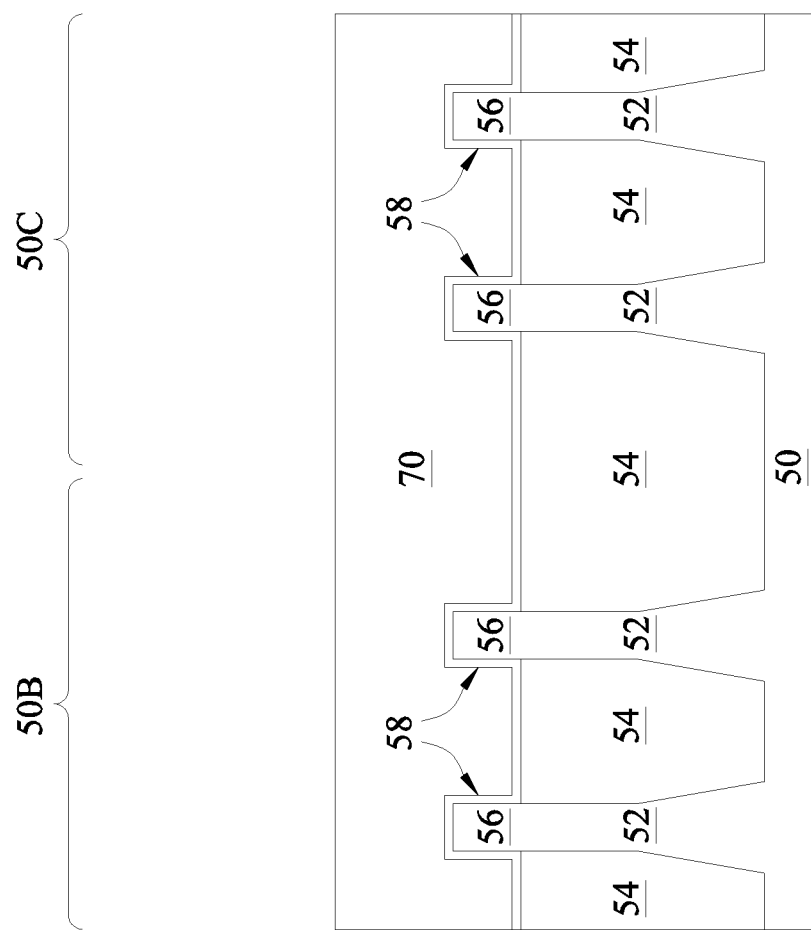

In FIGS. 11A and 11B, a planarization process, such as a CMP, may be performed to level the top surface of the ILD 88 with the top surfaces of the dummy gates 70. The planarization process may also remove the masks 72 on the dummy gates 70, and portions of the gate seal spacers 80 and the gate spacers 86. After the planarization process, top surfaces of the dummy gates 70, the gate seal spacers 80, the gate spacers 86, and the ILD 88 are level. Accordingly, the top surfaces of the dummy gates 70 are exposed through the ILD 88.

Figure 12B:
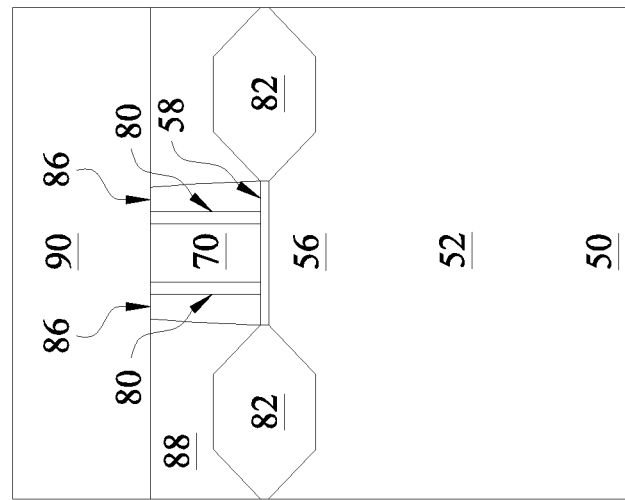
Figure 12A:
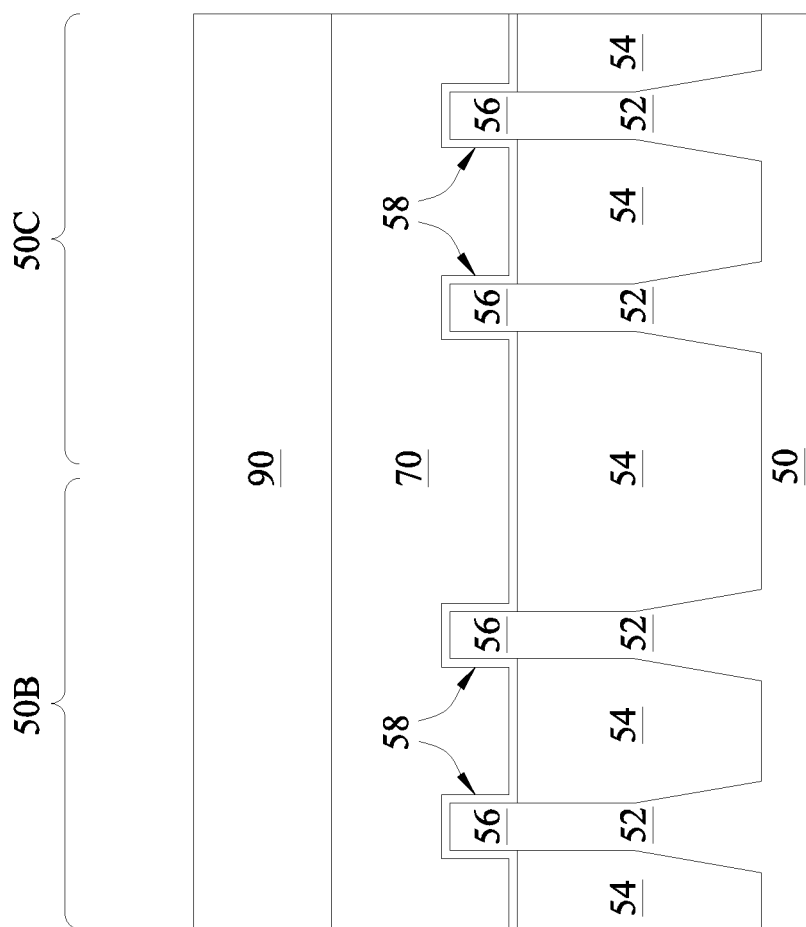

In FIGS. 12A and 12B, a mask layer 90, such as a hard mask, is deposited over the structure illustrated in FIGS. 11A and 11B. The mask layer 90 may be made of SiN, SiON, SiO$_2$, the like, or a combination thereof. The mask layer 90 may be formed by CVD, PVD, atomic layer deposition (ALD), a spin-on-dielectric process, the like, or a combination thereof.

In FIGS. 13A and 13B, a photoresist 92 is formed and patterned over the mask layer 90. In some embodiments, the photoresist 92 can be formed by using a spin-on technique and can be patterned using acceptable photolithography techniques. After the photoresist 92 is patterned, a trimming process may be performed on the photoresist 92 to reduce the width of the patterned photoresist 92. In an embodiment, the trimming process is an anisotropic plasma etch process with process gases including O$_2$, CO$_2$, N$_2$/H$_2$, H$_2$, the like, a combination thereof, or any other gases suitable for trimming photoresist.

In some embodiments, the photoresist 92 is a tri-layer photoresist. In these embodiments, the tri-layer photoresist 92 includes a top photoresist layer, a middle layer, and a bottom layer. As the limits of photolithography processes are reached by advanced semiconductor manufacturing processes, the need for thinner top photoresist layers has arisen to achieve smaller process windows. However, thin top photoresist layers may not be sufficiently robust to support the etching of target layers (e.g., the mask layer 90). The tri-layer photoresist provides a relatively thin top photoresist layer. The middle layer may include anti-reflective materials (e.g., a backside anti-reflective coating (BARC) layer) to aid the exposure and focus of the top photoresist layer's processing. By having the middle layer, the thin top photoresist layer is only used to pattern the middle layer. The bottom layer may include a hard mask material such as a carbon-containing material that is easily removed by O$_2$ or a N$_2$/H$_2$ plasma. The middle layer is used to pattern the bottom layer. In some embodiments, the middle layer has a high etch selectivity to the bottom layer, and, in some embodiments, the bottom layer is more than ten times thicker than the middle layer. Thus, the tri-layer photoresist 92 allows for the robust patterning of underlying layers (e.g., the mask layer 90) while still providing a relatively thin top photoresist layer.

The top photoresist layer of the tri-layer photoresist 92 may be patterned using any suitable photolithography technique. For example, a photomask (not shown) may be disposed over the top photoresist layer, which may then be exposed to a radiation beam including an ultraviolet (UV) or an excimer laser such as a 248 nm beam from a Krypton Fluoride (KrF) excimer laser, a 193 nm beam from an Argon Fluoride (ArF) excimer laser, or a 157 nm beam from a F$_2$ excimer laser. Exposure of the top photoresist layer may be performed using an immersion lithography system to increase resolution and decrease the minimum achievable pitch. A bake or cure operation may be performed to harden the top photoresist layer, and a developer may be used to remove either the exposed or unexposed portions of the top photoresist layer depending on whether a positive or negative resist is used. After the patterning of the top photoresist layer of the tri-layer photoresist 92, a trimming process may be performed to reduce the width of the top photoresist layer of the tri-layer photoresist 92. In an embodiment, the trimming process is an anisotropic plasma etch process with process gases including O$_2$, CO$_2$, N$_2$/H$_2$, H$_2$, the like, a combination thereof, or any other gases suitable for trimming photoresist. After the trimming process, the middle and bottom layers may be patterned leaving the patterned tri-layer photoresist 92 illustrated in FIGS. 13A and 13B.

Figure 14B:
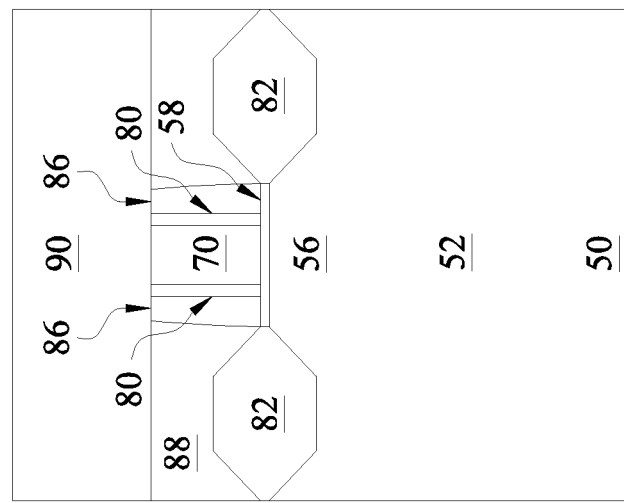
Figure 14A:
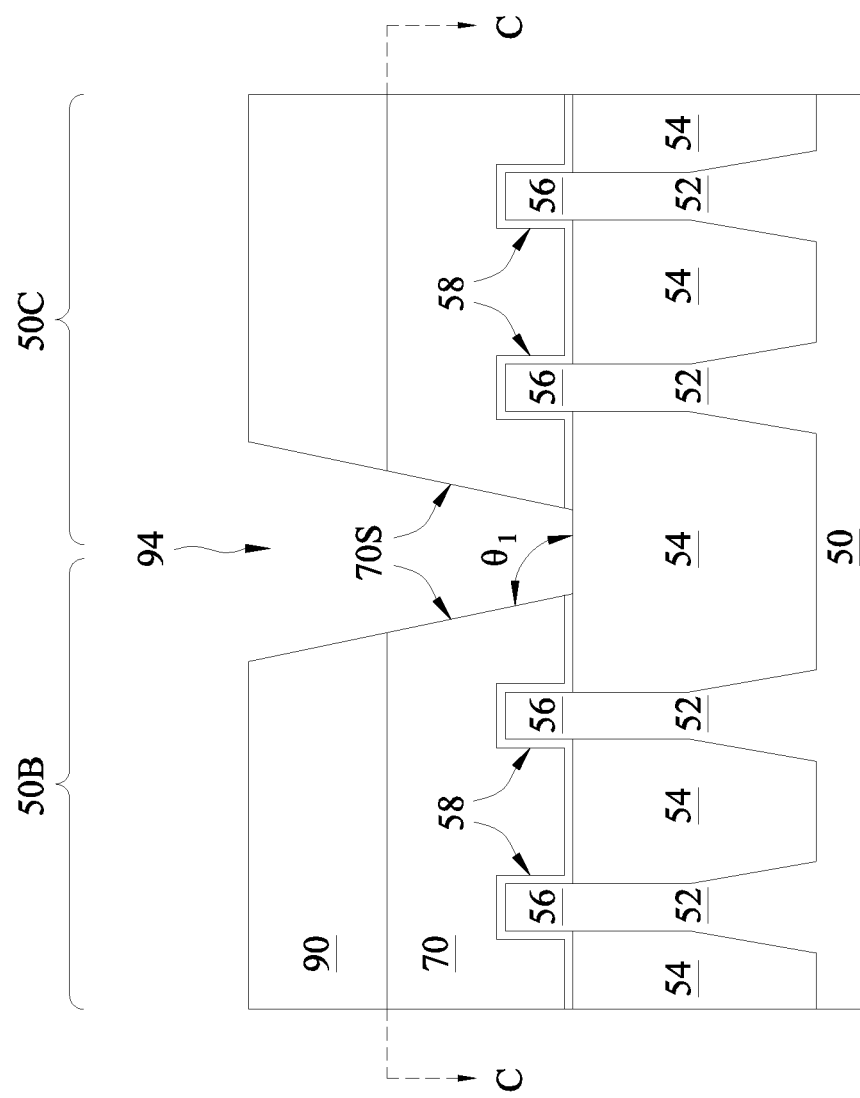
Figure 14C:
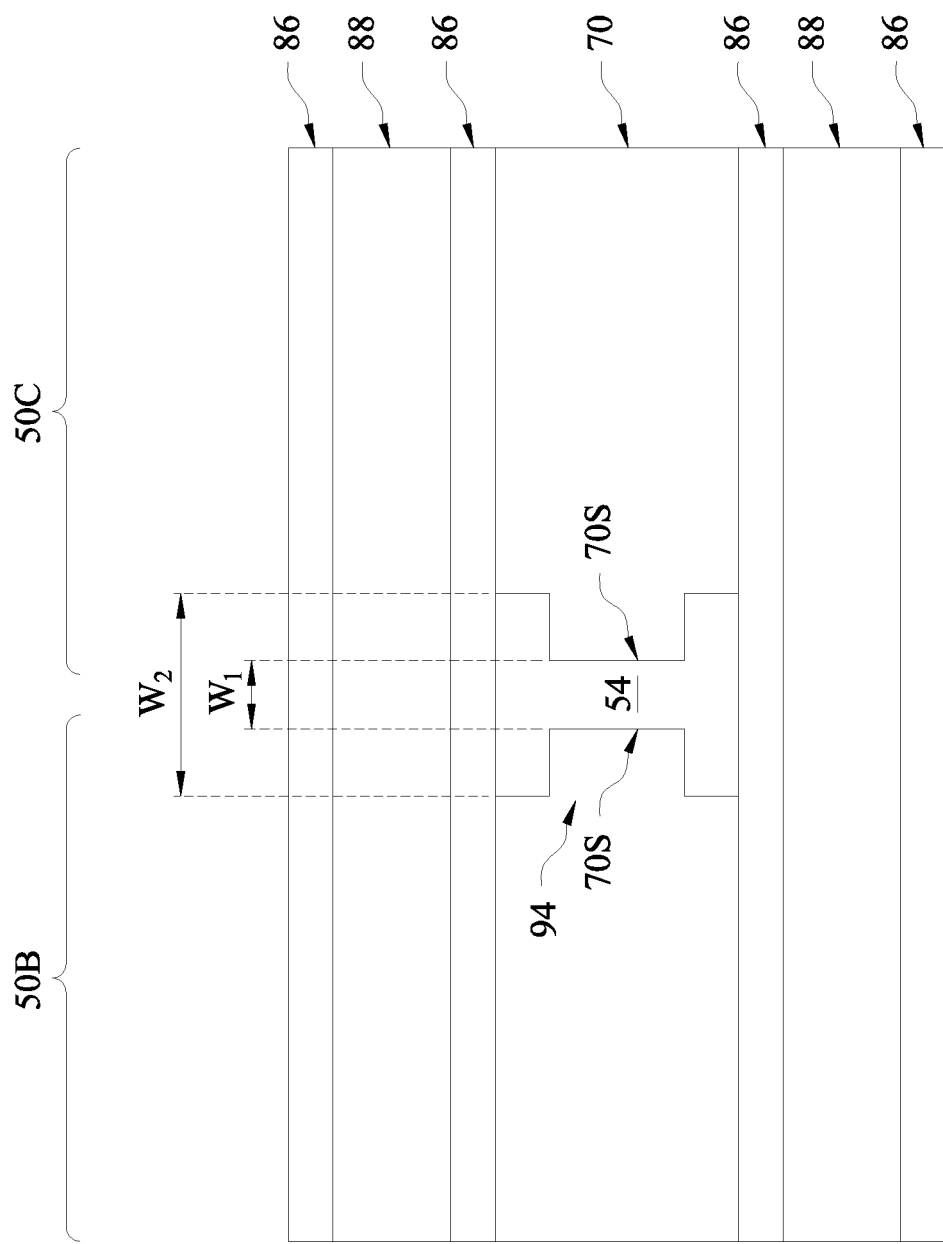

In FIGS. 14A, 14B, and 14C, the mask layer 90 and the dummy gates 70 are patterned using the photoresist 92 as a mask. The patterning of the mask layer 90 may be performed using any acceptable etching process, such as an anisotropic dry etch process. The etching process may be continued to pattern the dummy gates 70. In some embodiments, portions of the dummy dielectric layer 58 may also be removed by the etching process. The patterning forms openings 94 separating fins 56 in the first region 50B from fins 56 in the second region 50C. Top surfaces of the isolation regions 54 may be exposed by the openings 94. The photoresist 92 is then removed.

The openings 94 are defined by the exposed surfaces of the isolation regions 54, sidewalls 70S of the remaining portions of the dummy gates 70, and inner surfaces of the gate spacers 86. In some embodiments, the sidewalls 70S of the remaining dummy gates 70 are slanted relative to a major surface of the substrate 50. In other words, the sidewalls 70S of the remaining portions of the dummy gates 70 are not parallel and not perpendicular to the major surface of the substrate 50. In some embodiments, the sidewalls 70S of the remaining portions of the dummy gates 70 form an angle $\theta_1$ with a plane parallel to the major surface of the substrate 50. In an embodiment, the angle $\theta_1$ is greater than about 90°, such as is in a range from about 92° to about 97°. Further, as measured in a direction perpendicular to longitudinal axes of the fins 56, the openings 94 are narrower at their interfaces with the isolation regions 54 (e.g., bottom of the openings 94) than at their top, such that the openings 94 taper from the top towards the bottom. Further, the openings 94 have a dumbbell shape in a plan view. As a result, a first width $W_1$ of the openings 94 in a center portion distal the gate spacers 86 is less than a second width $W_2$ of the openings 94 in an edge portion proximate the gate spacers 86.

Figure 15B:
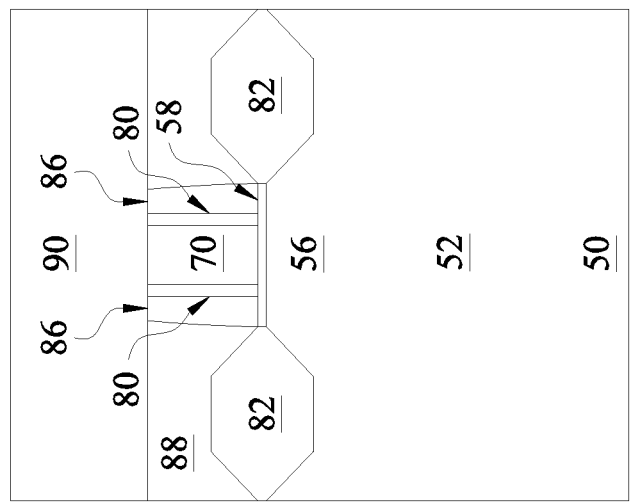
Figure 15A:
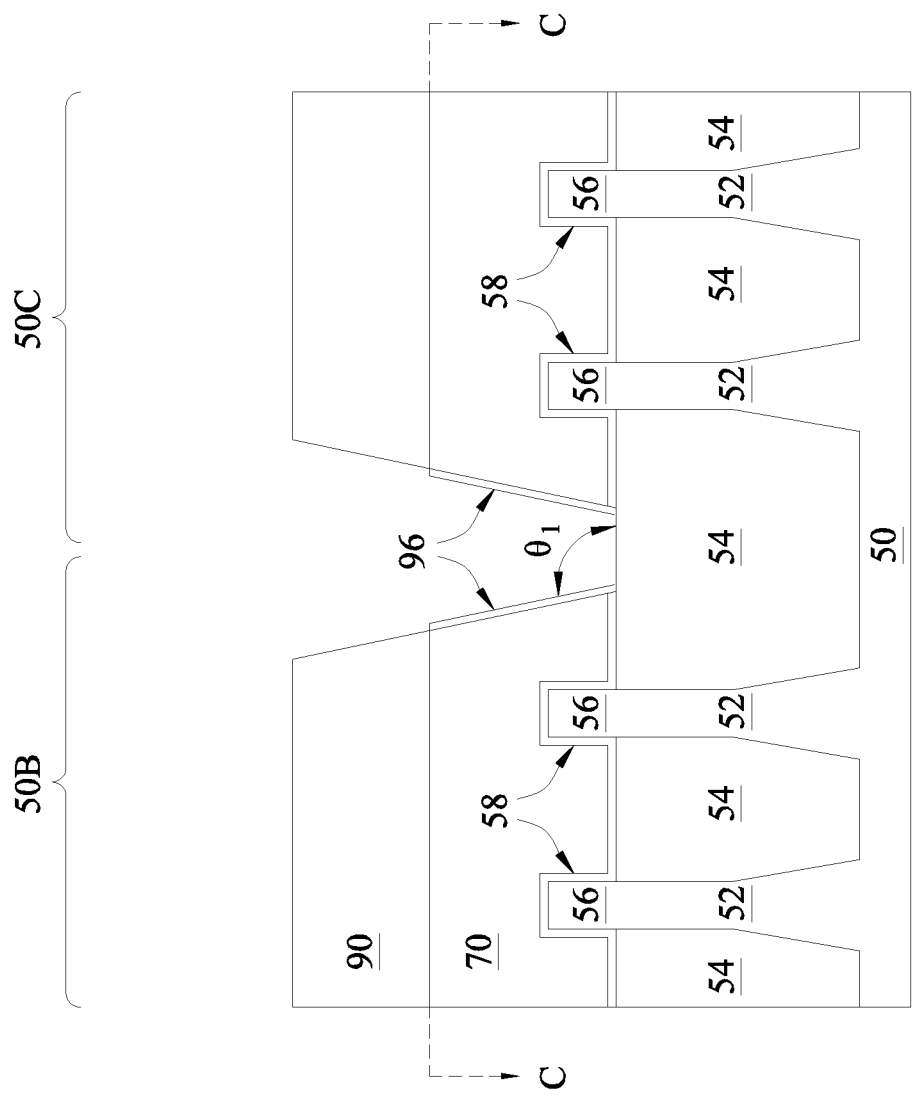
Figure 15C:
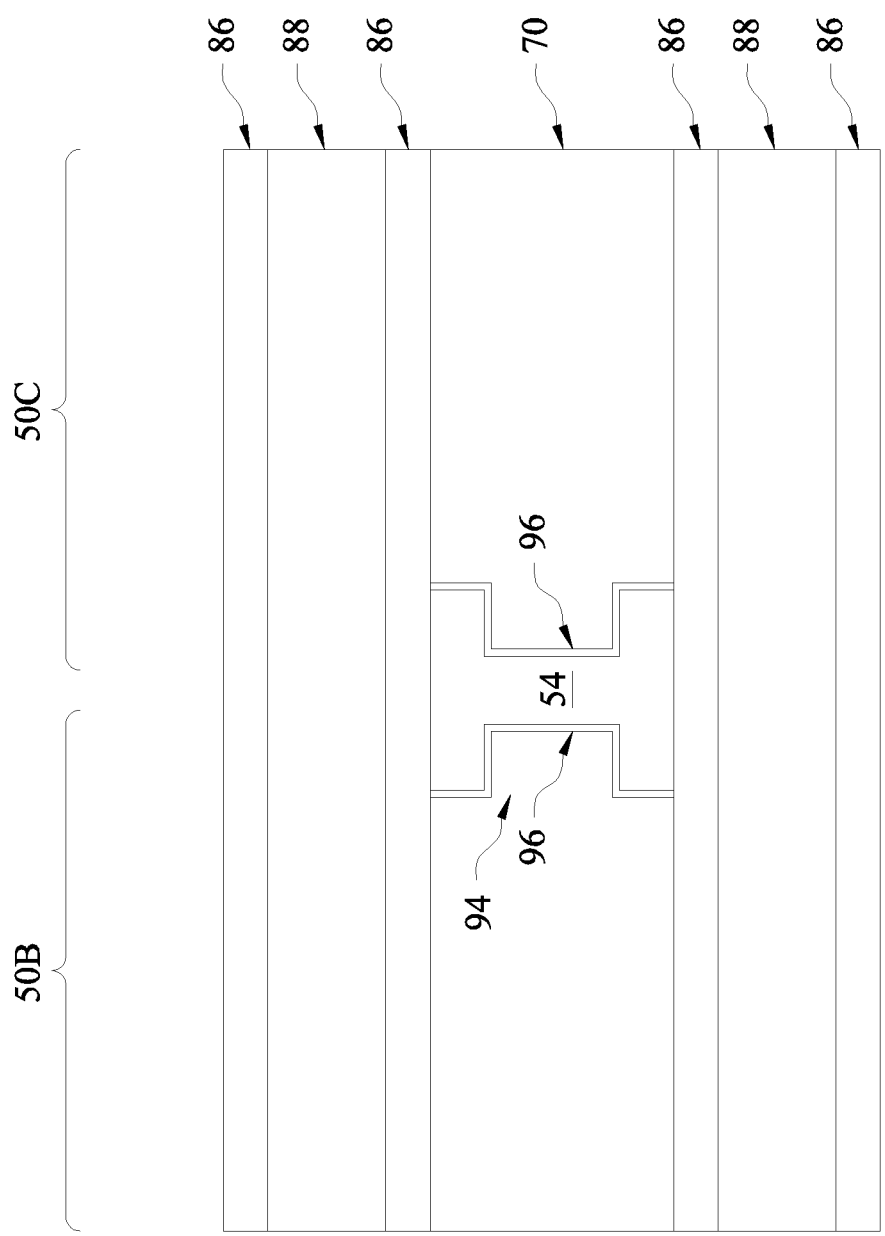

In FIGS. 15A, 15B, and 15C, a sacrificial oxide 96 is formed on exposed sidewalls of the dummy gates 70 in the openings 94. The sacrificial oxide 96 is an oxide of the material the dummy gates 70, and may be, e.g., native oxide, a plasma oxide, or the like. The sacrificial oxide 96 may be similar to the dummy dielectric layer 58, or may be different. The sacrificial oxide 96 may be formed using an oxidation process such as a thermal oxidation process, a rapid thermal oxidation (RTO) process, a chemical oxidation process, an in-situ stream generation (ISSG) process, or an enhanced in-situ stream generation (EISSG) process. For example, a rapid thermal anneal (RTA) may be performed in an oxygen-containing environment. The thermal oxidation may be performed at a temperature of from about 800° C. to about 1100° C., such as about 800° C. The temperature may contribute to the thickness of the sacrificial oxide 96; higher temperatures may result in a thicker sacrificial oxide 96. The thermal oxidation may be performed for a time span of from about 10 seconds to about 20 seconds, such as about 15 seconds. The time span may also contribute to the thickness of the sacrificial oxide 96; longer oxidation time spans may result in a thicker sacrificial oxide 96. After completion, the thermal oxidation may form the sacrificial oxide 96 to a thickness of from about 28 Å to about 56 Å, such as about 40 Å. In some embodiments, other oxidation processes may be performed. The oxidation process may only oxidize the material of the dummy gates 70, such that the sacrificial oxide 96 is only formed on sidewalls of the dummy gates 70 and is not formed on the mask layer 90.

Figure 16C:
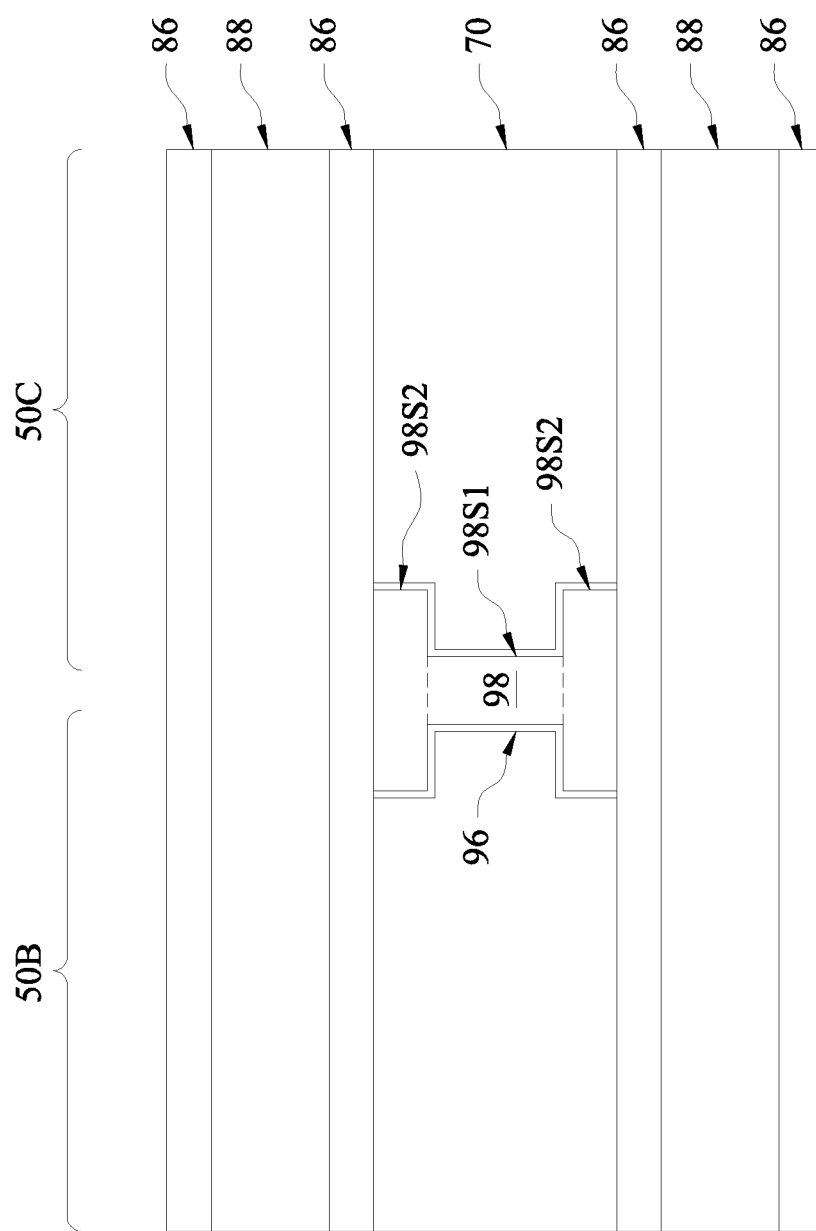

In FIGS. 16A, 16B, and 16C, an insulation material is formed in the openings 94 to form isolation regions 98. The isolation regions 98 provide isolation between the dummy gates 70 in the first region 50B and the dummy gates 70 in the second region 50C. The insulation material may be an oxide, such as silicon oxide, a nitride, the like, or a combination thereof, and may be formed by a HDP-CVD, FCVD (e.g., a CVD-based material deposition in a remote plasma system and post curing to make it convert to another material, such as an oxide), the like, or a combination thereof. Other insulation materials formed by any acceptable process may be used. The insulation material of the isolation regions 98 may be the same as the insulation material 54, or may be different. In the illustrate embodiment, the insulation material is silicon nitride. After formation, the isolation regions 98 are sandwiched between the sacrificial oxides 96 formed on respective sidewalls of the openings 94. In embodiments where the isolation regions 98 are formed from SiN, the structure formed in the openings 94 may be referred to an oxide-SiN-oxide sandwich structure, or more generally may be referred to an oxide-nitride-oxide sandwich structure.

The shape of the isolation regions 98 is defined by the openings 94, e.g., the exposed surfaces of the isolation regions 54, the exposed sidewalls of the dummy gates 70, and the exposed sidewalls of the gate spacers 86. In other words, the isolation regions 98 may have a shape similar to that of the openings 94. As such, the width at the bottom of the isolation regions 98 may be narrower than the width at the top of the isolation regions 98 (e.g., FIG. 16A), and the isolation region 98 may have a dumbbell shape in a plan view (e.g., FIG. 16C). The longitudinal axis of the isolation region 98 is parallel to the longitudinal axes of the fins 56. Sidewalls of the isolation regions 98 between the neighboring gate spacers 86 have the angle $\theta_1$ with a plane parallel to the major surface of the substrate 50, similar to the corresponding sidewalls 70S of the remaining dummy gates 70. Further, the sidewalls 70S of the remaining dummy gates 70 are not planar, but rather are convex in a top-view with the isolation regions 98 being wider in the top-view. In the top-view, the isolation regions 98 have the dumbbell shape. The isolation regions include a middle portion 98S1 having the first width $W_1$, and edge portions 98S2 having the second width $W_2$. The edge portions 98S2 contact sidewalls of neighboring gate spacers 86, and the middle portion 98S1 extends between the edge portions 98S2.

Figure 17B:
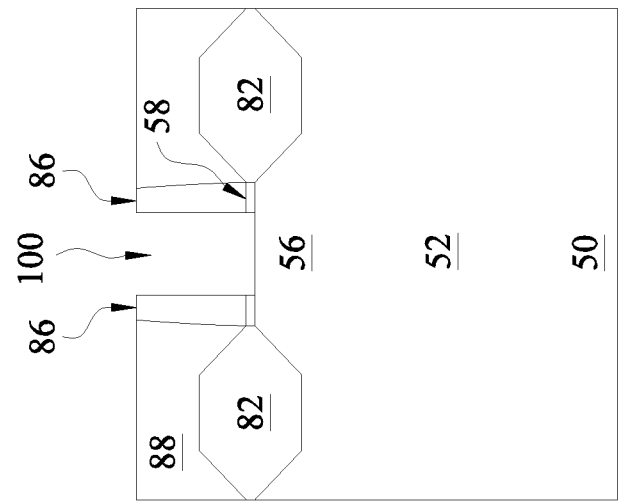
Figure 17A:
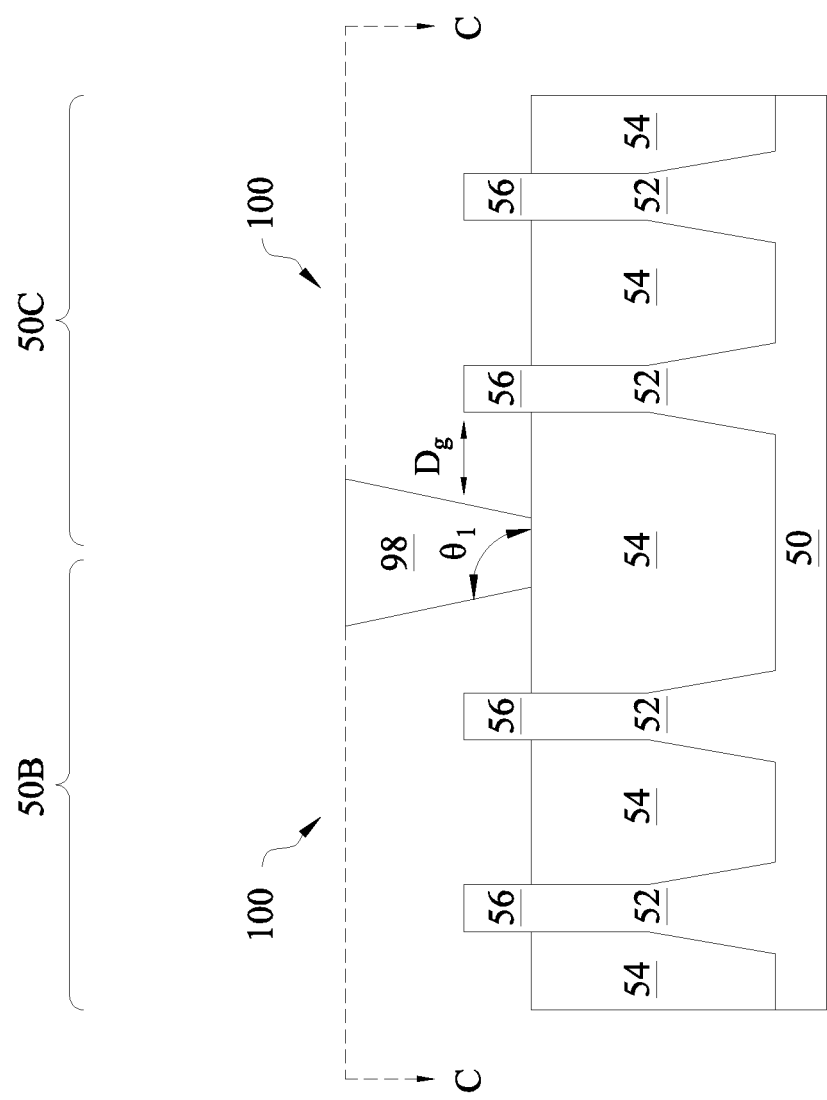
Figure 17C:
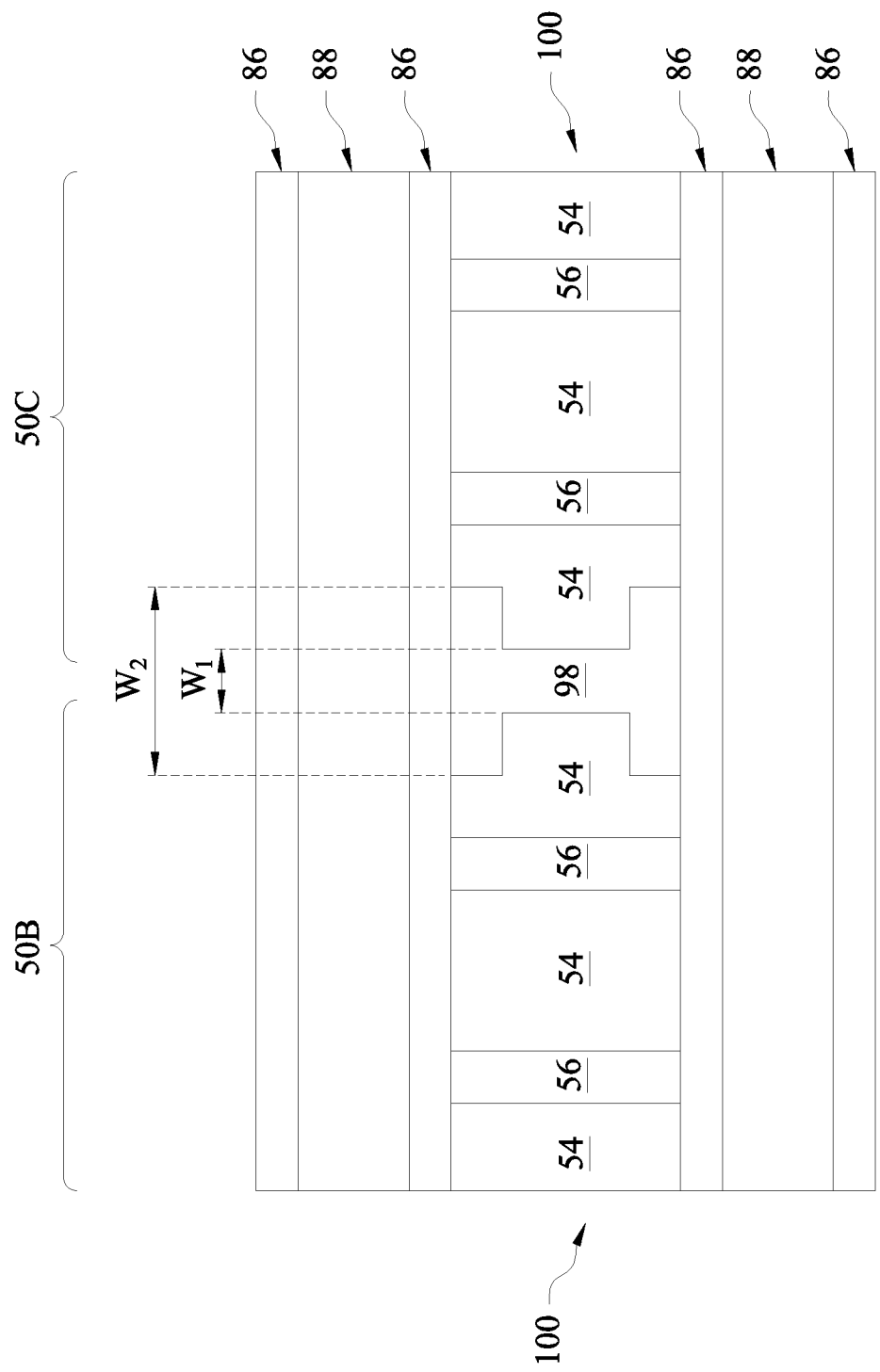

In FIGS. 17A, 17B, and 17C, the sacrificial oxide 96, the gate seal spacers 80, portions of the dummy dielectric layer 58 directly underlying the exposed dummy gates 70, and the remaining portions of the dummy gates 70 are removed in an etching step(s), so that recesses 100 are formed. In some embodiments, the dummy gates 70 are removed by an anisotropic dry etch process. For example, the etching process may include a dry etch process using reaction gas(es) that selectively etches the dummy gates 70 without etching the isolation regions 98, the ILD 88, or the gate spacers 86. Each recess 100 exposes a channel region of a respective fin 56. Each channel region is disposed between neighboring pairs of epitaxial source/drain regions 82. During the removal, the dummy dielectric layer 58 may be used as an etch stop layer when the dummy gates 70 are etched. The dummy dielectric layer 58 and gate seal spacers 80 may then be removed after the removal of the dummy gates 70.

The sacrificial oxide 96 may be removed in the same etching step(s) used to remove the dummy dielectric layer 58. The etching step(s) performed may be selective to the material of the sacrificial oxide 96 and/or the dummy dielectric layer 58. Removing the sacrificial oxide 96 may increase the gap fill distance $D_g$ (sometimes called the "gap fill window") between the isolation regions 98 and the fins 56. During the formation of metal gate electrodes 104 (shown below), the metal may be formed along sidewalls of the isolation regions 98 and the fins 56. Increasing the gap fill window may improve the window for metal filling, which may reduce the chance of the metal merging during formation along each sidewall. Doing so may avoid the formation of pits and voids in the completed FinFET device. In addition to improving the window for metal filling, increasing the gap fill window may also improving the window for etching. The gap fill distance $D_g$ may be controlled by adjusting parameters of the oxidation process used to form the sacrificial oxide 96, thereby controlling the thickness of the sacrificial oxide 96.

Figure 18C:
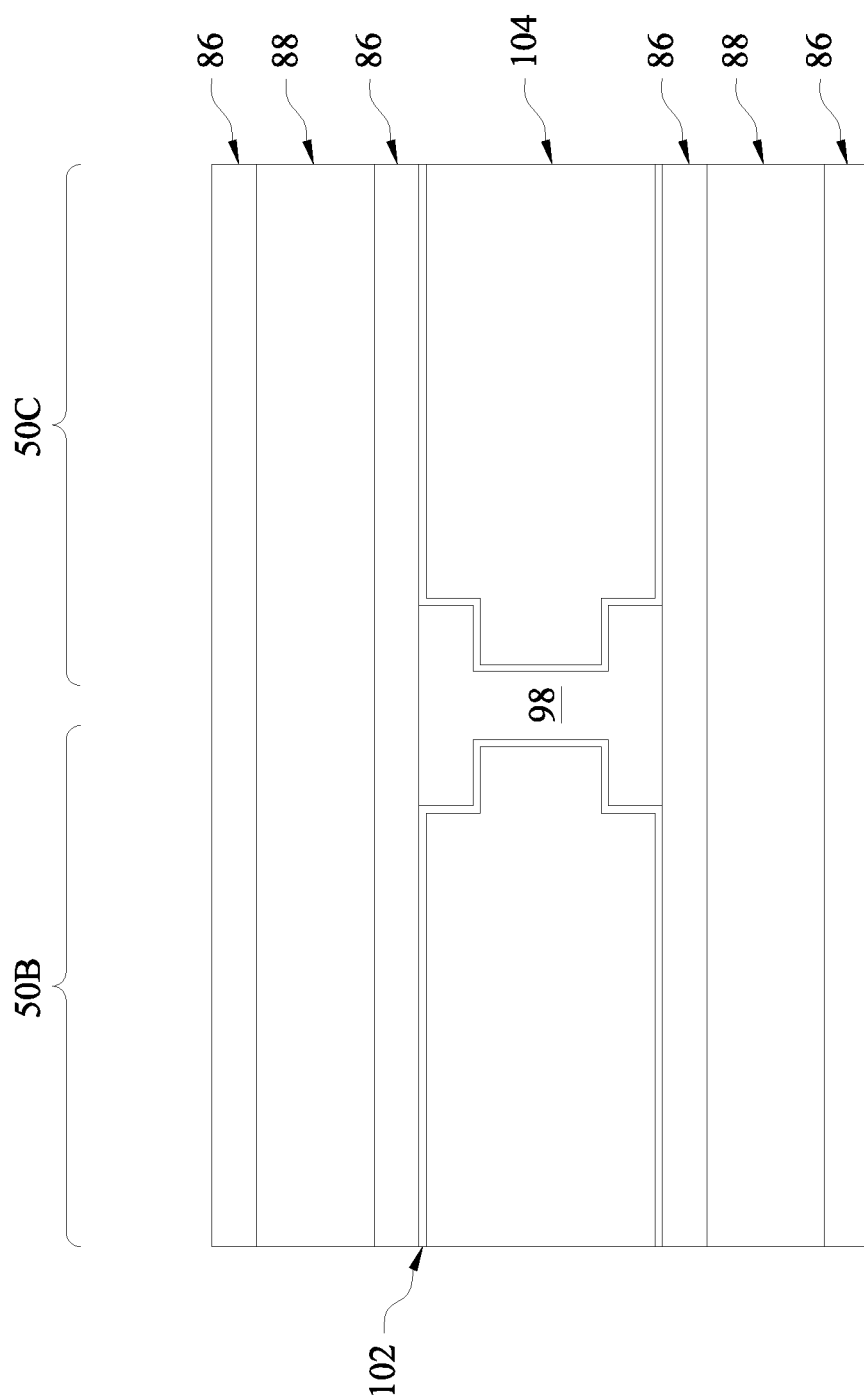

In FIGS. 18A, 18B, and 18C, gate dielectric layers 102 and gate electrodes 104 are formed for replacement gates. The gate dielectric layers 102 are deposited conformally in recesses 100, such as on the top surfaces and the sidewalls of the fins 56 and on sidewalls of the gate spacers 86, and on a top surface of the ILD 88. The gate dielectric layers 102 may (or may not) be deposited on sidewalls of the isolation regions 98. In accordance with some embodiments, the gate dielectric layers 102 comprise silicon oxide, silicon nitride, or multilayers thereof. In other embodiments, the gate dielectric layers 102 comprise a high-k dielectric material, and in these embodiments, the gate dielectric layers 102 may have a k value greater than about 7.0, and may include a metal oxide or a silicate of Hf, Al, Zr, La, Mg, Ba, Ti, Pb, and combinations thereof. The formation methods of the gate dielectric layers 102 may include Molecular-Beam Deposition (MBD), ALD, PECVD, and the like.

Next, the gate electrodes 104 are deposited over gate dielectric layers 102, respectively, and fill the remaining portions of the recesses 100. Gate electrodes 104 may comprise a metal-containing material such as TiN, TaN, TaC, Co, Ru, Al, combinations thereof, or multi-layers thereof. After the filling of the gate electrodes 104, a planarization process, such as a CMP, may be performed to remove the excess portions of gate dielectric layers 102 and the material of gate electrodes 104, which excess portions are over the top surface of ILD 88 and the isolation regions 98. After the planarization process, top surfaces of the isolation regions 98, the gate dielectric layers 102, and the gate electrodes 104 are level. The resulting remaining portions of material of gate electrodes 104 and gate dielectric layers 102 thus form replacement gates of the resulting FinFETs. The replacement gates may be collectively referred to as "gate stacks" or simply "gates."

The formation of the gate dielectric layers 102 may occur simultaneously such that the gate dielectric layers 102 comprise the same materials, and the formation of the gate electrodes 104 may occur simultaneously such that the gate electrodes 104 comprise the same materials. However, in other embodiments, the gate dielectric layers 102 may be formed by distinct processes, such that the gate dielectric layers 102 may comprise different materials, and the gate electrodes 104 may be formed by distinct processes, such that the gate electrodes 104 may comprise different materials. Various masking steps may be used to mask and expose appropriate regions when using distinct processes.

After the formation of the replacement gates, the isolation regions 98 separate the replacement gates in the first region 50B from the replacement gates in the second region 50C that have the same longitudinal axis. The isolation regions 98 provide isolation between the replacement gates in the first region 50B and the replacement gates in the second region 50C.

Figure 19C:
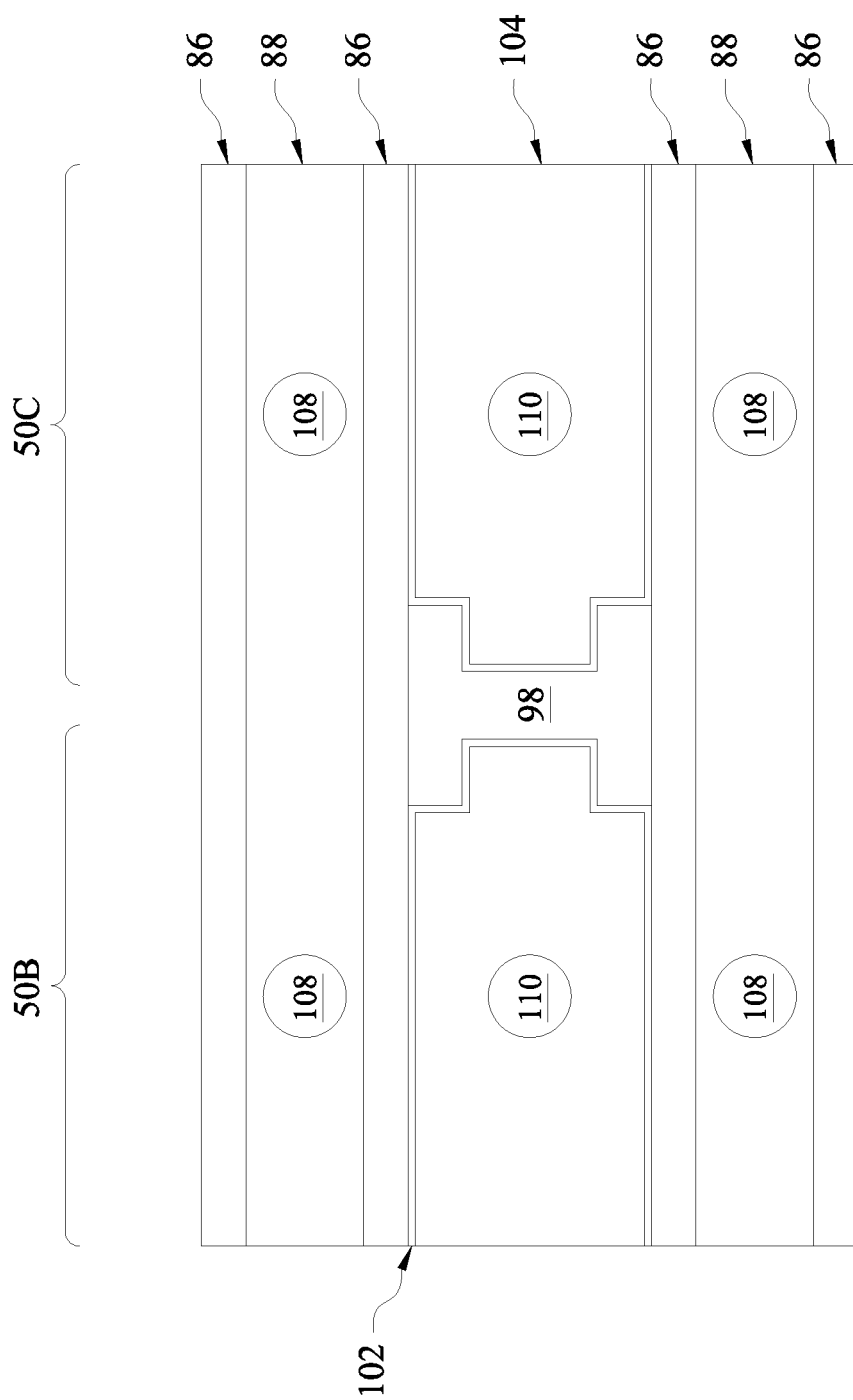

In FIGS. 19A, 19B, and 19C, an ILD 106 is deposited over the ILD 88, and contacts 108 and 110 are formed through the ILD 106 and the ILD 88. The ILD 106 is formed over the ILD 88, the replacement gates, the gate spacers 86, and the isolation regions 98. The ILD 106 is formed of a dielectric material such as PSG, BSG, BPSG, USG, or the like, and may be deposited by any suitable method, such as CVD and PECVD. Openings for contacts 108 and 110 are formed through the ILDs 88 and 106. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD 106. The remaining liner and conductive material form the contacts 108 and 110 in the openings. An anneal process may be performed to form a silicide at the interface between the epitaxial source/drain regions 82 and the contacts 108, respectively. The contacts 108 are physically and electrically coupled to the epitaxial source/drain regions 82. The contacts 110 are physically and electrically coupled to the gate electrodes 104.

Although not explicitly shown, a person having ordinary skill in the art will readily understand that further processing steps may be performed on the structure in FIGS. 19A, 19B, and 19C. For example, various Inter-Metal Dielectrics (IMD) and their corresponding metallizations may be formed over the ILD 106.

Embodiments may achieve advantages. Thinning the isolation regions between the fins may increase the gap fill and etching windows of the device, which may avoid formation of voids and pits in the final device. Increasing the gap fill window may allow polysilicon to be used for the dummy gates instead of other materials. Forming the dummy gate layer from a polysilicon instead of a metal may reduce the amount of ILD lost by up to 30 nm when the dummy gates are replaced. Polysilicon dummy gates may be easier to replace as device sizes, and subsequently gate sizes, are shrunk.

In an embodiment, a device includes: a first fin extending from a substrate; a second fin extending from the substrate, the second fin and the first fin having parallel longitudinal axes; a first isolation material surrounding the first fin and the second fin; a first gate stack over the first fin; a second gate stack over the second fin; and a second isolation material contacting the first isolation material, the second isolation material disposed between the first gate stack and the second gate stack, the second isolation material having a longitudinal axis being parallel to the longitudinal axes of the first fin and the second fin, the second isolation material being different from the first isolation material.

In some embodiments of the device, the second isolation material includes silicon nitride. In some embodiments of the device, the first gate stack includes: a first gate dielectric over the first isolation material and contacting sidewalls of the second isolation material; and a first gate electrode over the first gate dielectric. In some embodiments of the device, the first gate electrode is disposed between the first fin and the second isolation material. In some embodiments of the device, top surfaces of the first gate electrode, the first gate dielectric, and the second isolation material are planar. In some embodiments, the device further includes: gate spacers adjacent the first gate stack and the second gate stack. In some embodiments of the device, the second isolation material is further disposed between neighboring ones of the gate spacers. In some embodiments of the device, the second isolation material has a first width proximate the gate spacers, and a second width distal the gate spacers, the first width and the second width being measured along a latitudinal axis of the second isolation material, the latitudinal axis of the second isolation material being perpendicular to the longitudinal axis of the second isolation material. In some embodiments of the device, sidewalls of the second isolation material form an obtuse angle with a plane parallel to a major surface of the substrate.

In an embodiment, a device includes: a first transistor including a first source region, a first drain region, and a first gate, the first transistor being in a first fin; a second transistor including a second source region, a second drain region, and a second gate, the second transistor being in a second fin; a first isolation material surrounding a lower portion of the first fin and a lower portion of the second fin; a second isolation material on the first isolation material, the second isolation material separating the first gate from the second gate, a sidewall of the second isolation material forming an obtuse angle with a plane parallel to a major surface of the first isolation material, the first fin, the second fin, and the second isolation material each having a parallel longitudinal axis; and a first inter-layer dielectric (ILD) on the first isolation material, the first ILD surrounding the first source region, the second source region, the first drain region, and the second drain region.

In some embodiments of the device, the second isolation material has a middle portion with a first width and edge portions with a second width, the first width being less than the second width, the first width and the second width being measured along a latitudinal axis of the second isolation material, the latitudinal axis of the second isolation material being perpendicular to the longitudinal axis of the second isolation material. In some embodiments of the device, the first gate includes: a first gate dielectric contacting the first fin, the major surface of the first isolation material, and the sidewall of the second isolation material; and a first gate electrode over the first gate dielectric. In some embodiments of the device, top surfaces of the first gate electrode, the first gate dielectric, and the second isolation material are planar. In some embodiments, the device further includes: a second ILD on the first ILD and the second isolation material; and a first contact extending through the second ILD to physically and electrically connect to the first gate; and a second contact extending through the first ILD and the second ILD to physically and electrically connect to the first source region.

In an embodiment, a device includes: a first fin extending from a substrate; a second fin extending from the substrate; a first isolation material surrounding the first fin and the second fin; a second isolation material contacting the first isolation material, the second isolation material being disposed between the first fin and the second fin; a first gate dielectric extending along a first sidewall of the second isolation material, a major surface of the first isolation material, sidewalls of the first fin, and a top surface of the first fin; a first gate electrode contacting the first gate dielectric; a second gate dielectric extending along a second sidewall of the second isolation material, the major surface of the first isolation material, sidewalls of the second fin, and a top surface of the second fin; and a second gate electrode contacting the second gate dielectric.

In some embodiments of the device, the second isolation material is disposed between the first gate electrode and the second gate electrode. In some embodiments of the device, the first and second sidewalls of the second isolation material form obtuse angles with a plane parallel to the major surface of the first isolation material. In some embodiments, the device further includes: gate spacers extending along sides of the first gate electrode, the second gate electrode, and the second isolation material. In some embodiments of the device, the second isolation material has a middle portion with a first width and edge portions with a second width, the first width being less than the second width, the edge portions being disposed adjacent the gate spacers, the middle portion being disposed between the edge portions. In some embodiments of the device, top surfaces of the second isolation material, first gate dielectric, first gate electrode, second gate dielectric, and the second gate electrode are planar.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first fin extending from a substrate;
   a first gate stack on the first fin;
   a second fin extending from the substrate;
   a second gate stack on the second fin; and
   a first isolation region disposed between the first gate stack and the second gate stack, the first isolation region comprising:
   a first edge portion;
   a second edge portion; and
   a middle portion disposed between the first edge portion and the second edge portion along a first direction, the middle portion being narrower than each of the first edge portion and the second edge portion along a second direction, the first direction being parallel to longitudinal axes of the first fin and the second fin, the second direction being perpendicular to the first direction.

2. The device of claim 1 further comprising:
   a first gate spacer extending along first sidewalls of the first gate stack, the second gate stack, and the first edge portion of the first isolation region; and
   a second gate spacer extending along second sidewalls of the first gate stack, the second gate stack, and the second edge portion of the first isolation region.

3. The device of claim 1, wherein the first gate stack comprises a first gate dielectric on the first fin, and a first gate electrode on the first gate dielectric, wherein the second gate stack comprises a second gate dielectric on the second fin, and a second gate electrode on the second gate dielectric, and wherein the first gate dielectric and the second gate dielectric extend along sidewalls of the first isolation region.

4. The device of claim 3, wherein each of the sidewalls of the first isolation region form an obtuse angle with a plane parallel to a major surface of the substrate.

5. The device of claim 4, wherein the obtuse angle is in a range of 92 degrees to 97 degrees.

6. The device of claim 1, wherein the first isolation region comprises silicon nitride.

7. The device of claim 1 further comprising:
   a second isolation region surrounding the first fin and the second fin, the second isolation region disposed between the first isolation region and the substrate.

8. The device of claim 7, wherein the first isolation region and the second isolation region comprise the same dielectric material.

9. The device of claim 7, wherein the first isolation region and the second isolation region comprise different dielectric materials.

10. A device comprising:
    a first fin extending from a substrate;
    a second fin extending from the substrate;
    a first gate spacer over the first fin and the second fin;
    a second gate spacer over the first fin and the second fin; and
    a first isolation region disposed between the first gate spacer and the second gate spacer, the first isolation region comprising:
    a first edge portion contacting the first gate spacer;
    a second edge portion contacting the second gate spacer; and
    a middle portion disposed between the first edge portion and the second edge portion along a first direction, the middle portion being narrower than each of the first edge portion and the second edge portion along a second direction, the first direction extending from the first gate spacer to the second gate spacer, the second direction being perpendicular to the first direction.

11. The device of claim 10 further comprising:
a first gate stack on the first fin; and
a second gate stack on the second fin, the second gate stack separated from the first gate stack by the first isolation region.

12. The device of claim 10, wherein the first isolation region comprises silicon nitride.

13. The device of claim 10 further comprising:
a second isolation region surrounding the first fin and the second fin, the second isolation region disposed between the first isolation region and the substrate.

14. The device of claim 13, wherein the first isolation region and the second isolation region comprise the same dielectric material.

15. The device of claim 13, wherein the first isolation region and the second isolation region comprise different dielectric materials.

16. A device comprising:
a first transistor comprising a first epitaxial region, a first channel region adjacent the first epitaxial region, and a first gate over the first channel region;
a second transistor comprising a second epitaxial region, a second channel region adjacent the second epitaxial region, and a second gate over the second channel region;
a first isolation region disposed between the first gate and the second gate, the first isolation region comprising:
a first edge portion;
a second edge portion; and
a middle portion disposed between the first edge portion and the second edge portion along a first direction, the first direction being perpendicular to longitudinal axes of the first gate and the second gate, the first edge portion and the second edge portion each being wider than the middle portion along a second direction, the second direction being parallel to the longitudinal axes of the first gate and the second gate.

17. The device of claim 16 further comprising:
a gate spacer having a first portion and a second portion, the first portion disposed between the first epitaxial region and the first gate, the second portion disposed between the second epitaxial region and the second gate, the gate spacer contacting the first edge portion of the first isolation region.

18. The device of claim 16 further comprising:
a second isolation region disposed between the first channel region and the second channel region, the first isolation region and the second isolation region comprising the same dielectric material.

19. The device of claim 16 further comprising:
a second isolation region disposed between the first channel region and the second channel region, the first isolation region and the second isolation region comprising different dielectric materials.

20. The device of claim 16, wherein top surfaces of the first gate, the second gate, and the first isolation region are coplanar, the device further comprising:
an inter-layer dielectric (ILD) on the top surfaces of the first gate, the second gate, and the first isolation region;
a first contact extending through the ILD, the first contact connected to the first gate; and
a second contact extending through the ILD, the second contact connected to the second gate.

* * * * *